(12) United States Patent
Jacquet et al.

(10) Patent No.: US 8,906,750 B2
(45) Date of Patent: Dec. 9, 2014

(54) METHOD OF ENCAPSULATION OF A MICROCOMPONENT

(75) Inventors: Fabrice Jacquet, Saint Pierre de Mesage (FR); David Henry, Saint Ismier (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 2 days.

(21) Appl. No.: 13/977,897

(22) PCT Filed: Jan. 2, 2012

(86) PCT No.: PCT/EP2012/050023
§ 371 (c)(1),
(2), (4) Date: Jul. 1, 2013

(87) PCT Pub. No.: WO2012/093105
PCT Pub. Date: Jul. 12, 2012

(65) Prior Publication Data
US 2013/0288429 A1    Oct. 31, 2013

(30) Foreign Application Priority Data

Jan. 4, 2011 (FR) .................................... 11 50046
Jan. 4, 2011 (FR) .................................... 11 50047

(51) Int. Cl.
*H01L 21/00* (2006.01)
*B81C 1/00* (2006.01)
*B81B 7/00* (2006.01)

(52) U.S. Cl.
CPC ............ *B81C 1/00333* (2013.01); *B81B 7/007* (2013.01)
USPC ....................................................... 438/127

(58) Field of Classification Search
None
See application file for complete search history.

(56) References Cited

U.S. PATENT DOCUMENTS

| 8,159,056 | B1* | 4/2012 | Kim et al. ...................... 257/678 |
| 2007/0298532 | A1 | 12/2007 | Machauf |
| 2008/0164542 | A1* | 7/2008 | Yang et al. ..................... 257/415 |
| 2008/0283943 | A1 | 11/2008 | Dekker et al. |
| 2008/0290494 | A1 | 11/2008 | Lutz et al. |
| 2009/0194309 | A1 | 8/2009 | Gillot et al. |

(Continued)

FOREIGN PATENT DOCUMENTS

| EP | 1 101 730 A2 | 5/2001 |
| FR | 2 901 264 A1 | 11/2007 |

(Continued)

OTHER PUBLICATIONS

International Search Report Issued Apr. 3, 2013 in PCT/EP12/050023 Filed Jan. 2, 2012.
U.S. Appl. No. 13/381,241, filed Dec. 28, 2011, Pornin, et al.

*Primary Examiner* — Scott B Geyer
(74) *Attorney, Agent, or Firm* — Oblon, Spivak, McClelland, Maier & Neustadt, L.L.P.

(57) ABSTRACT

A method for encapsulating a microcomponent positioned on a substrate, including: a) production of an electrical contact pad on the substrate; b) production of a portion of sacrificial material covering the microcomponent and the electrical contact pad; c) production of an encapsulation layer covering the sacrificial material and a first face of the substrate; d) production, through the substrate, of a hole aligned with the electrical contact pad and emerging at the portion of sacrificial material; e) elimination of the portion of sacrificial material through the hole; f) production, in the hole, of a conductive portion electrically connected to the electrical contact pad, forming a conductive via.

18 Claims, 21 Drawing Sheets

(56) References Cited

U.S. PATENT DOCUMENTS

Figure 1A:
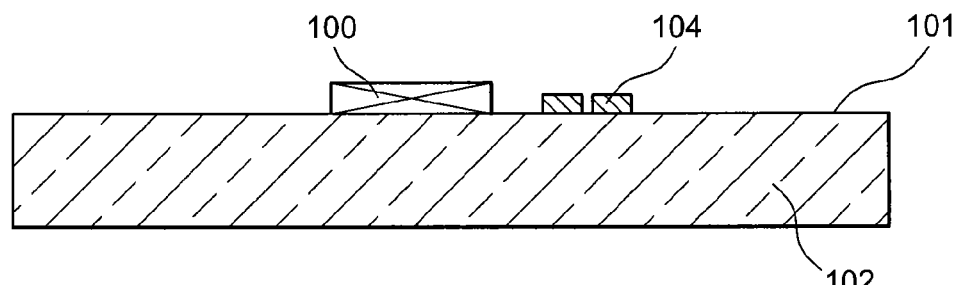

| | | |
|---|---|---|
| 2009/0275163 A1 | 11/2009 | Lacey et al. |
| 2010/0003789 A1* | 1/2010 | Caplet et al. .................. 438/124 |
| 2012/0112293 A1 | 5/2012 | Pornin et al. |
| 2013/0147319 A1* | 6/2013 | Adkisson et al. ............. 310/340 |

FOREIGN PATENT DOCUMENTS

| | | |
|---|---|---|
| WO | WO 2004/077523 A2 | 9/2004 |
| WO | 2007 057814 | 5/2007 |
| WO | 2009 134838 | 11/2009 |

* cited by examiner

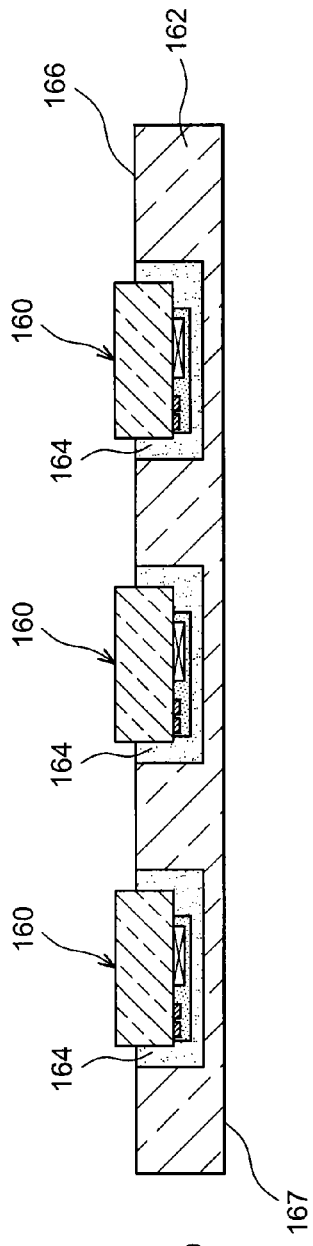
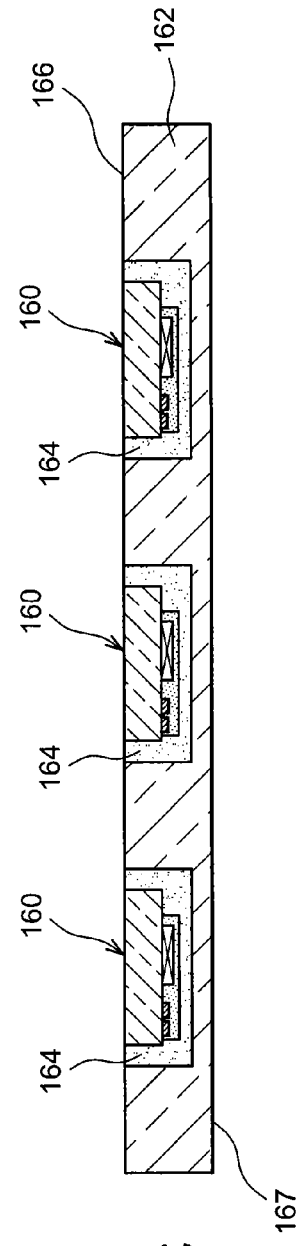
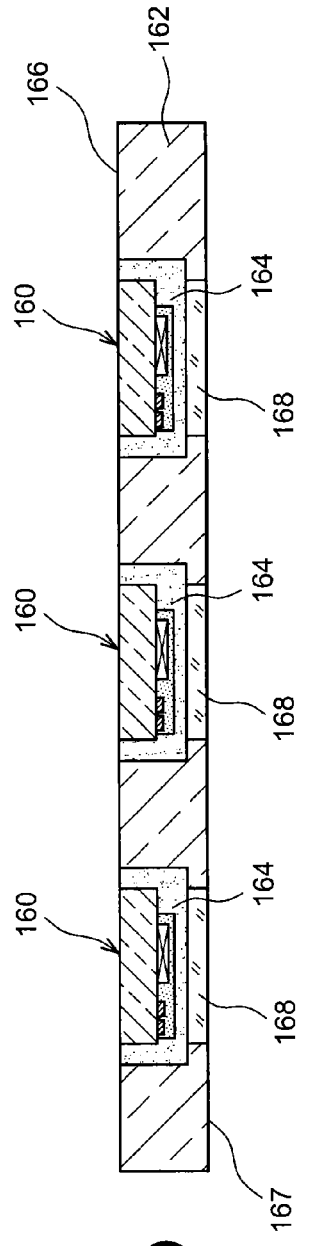
FIG. 8B
FIG. 8C
FIG. 8D

METHOD OF ENCAPSULATION OF A MICROCOMPONENT

TECHNICAL FIELD

The invention relates to the field of encapsulation, or packaging, of microcomponents.

The term "microcomponent" in this case designates any microsystem of the MEMS (MicroElectroMechanical System) type, NEMS (NanoElectroMechanical System) type, MOEMS (Micro-Opto-Electromechanical System) type, biochips, together with any type of electronic, optical or opto-electronic component.

The invention also relates to the field of 3D (three-dimensional) electronic devices, i.e. devices including several stacked electronic components, and in which heating problems are posed. Such 3D electronic devices are, for example, parallel microprocessors and/or microprocessors associated with thermally sensitive components such as memories or imagers, power devices involving high voltages and/or currents, or again devices including components of the MEMS type with high actuation voltages.

STATE OF THE PRIOR ART

Encapsulating a microcomponent generally consists in enclosing the microcomponent in a cavity delimited by a cap and by the substrate on which the microcomponent is produced. This cavity is generally hermetically sealed. This encapsulation enables the microcomponent to be protected mechanically, for example during implementation of steps such as cutting the substrate or overmoulding (packaging of the microcomponent). This encapsulation also enables the atmosphere present within the cavity to be controlled, by introducing, for example, a neutral gas which prevents any chemical reaction with the microcomponent, or by creating a vacuum in the cavity.

A first solution to encapsulate microcomponents consists in transferring caps, machined for example from a silicon plate, on the substrate comprising the microcomponents. These caps are either bonded or soldered at the wafer-level. The microcomponents encapsulated in this manner are then separated from one another by cutting the substrate, forming individual chips which are then assembled on electronic circuits.

This type of encapsulation by cap transfer nonetheless has several disadvantages: loss of area on the substrate due to the bonding or welding area required to attach the caps securely to the substrate, complexity of the transfer method implemented, etc.

An alternative solution to cap transfer consists in thin-layer packaging (PCM) of the microcomponents, as described, for example, in document EP 1 101 730 A2. In this solution each microcomponent is firstly covered by a sacrificial material which is etched to form a portion of sacrificial material the volume of which is equal to that of the cavity in which the microcomponent is to be encapsulated. A thin layer is then deposited on the sacrificial material. The sacrificial material is then etched via an aperture formed through the thin layer, thus forming a cavity in which the microcomponent is encapsulated, and which is delimited by the cap, i.e. by the thin layer.

PCM is ideally suited for encapsulating sensors of the MEMS type, and enables the sensitive parts of these sensors to be protected from the mechanical aggressions relating to the final steps of cutting, handling, etc.

However, PCM is not suitable for subsequent implementation of a step of overmoulding, which generally consists in injecting a polymer directly on the cap to form an overmoulding layer.

Such an overmoulding step involves thermomechanical stresses of the order of 100 to 200 bars and 150° C. to 200° C. for several tens of seconds, or possibly several minutes, applied to the encapsulated microcomponents. Such thermomechanical stresses can cause cracks in the PCM caps, making the encapsulated microcomponents unusable. And this overmoulding step is very important in the manufacture of the microcomponents, since it enables the microcomponent to be provided in the form of a chip, forming a finished product, protected from the external environment and ready to be incorporated by high-speed automatic means in the printed circuits, for example.

Document FR 2 901 264 A1 describes the production of a cap including a membrane reinforced by mechanical reinforcement means produced by structuring a top wall of the membrane, where the cap defines the cavity in which the microcomponent is encapsulated.

Such mechanical reinforcement of the cap is, however, not sufficient for the latter to be able to withstand pressures greater than or equal to approximately 100 bars, which are the pressure levels found when implementing a step of overmoulding of the encapsulated microcomponent.

Document WO 2004/077523 A2 describes a mechanical reinforcement of the cap by one or more depositions of very hard materials by vacuum-spraying of the cap, forming full-plate layers several micrometers thick, covering the entire substrate, where these layers must then be etched to form additional mechanical reinforcement layers covering the cap.

Use of such a method has, however, several disadvantages: risks of cracking of the cap due to the stress (i.e. mechanical stresses) caused by the depositions of mechanical reinforcement materials, deformation of the substrate on which the microcomponent is formed, etc.

In addition, the etching of the layers is problematic since the type of materials able to be used is limited to materials which can withstand such etching. Finally, the implementation time of such etching may be substantial.

In addition, all these different solutions to reinforce the cap lead to a substantial additional cost compared to that of the production of the microsystem.

Document WO 2007/057814 A2 describes a method of encapsulating a microcomponent in which a microcomponent is covered with a sacrificial layer. Electrical contacts are then made above the sacrificial layer. A temporary glass handle is then securely attached above the electrical contacts to eliminate the sacrificial layer from the rear face of the substrate.

This method requires access to both faces of the component, one face being used to produce the stages of electrical connections, and the other used for releasing the microcomponent. In addition, this method requires a temporary handle to be added, and later eliminated.

DESCRIPTION OF THE INVENTION

One aim of the present invention is to propose a method of encapsulating a microcomponent which does not have the problems of the encapsulation methods of the prior art, and which in particular enables an encapsulation structure to be obtained which does not have the fragility problems found with encapsulation of the PCM type when implementing subsequent steps involving handling the microcomponent (also called back-end operations), such as overmoulding or cutting of the substrate, and where this does not require additional lithographic steps compared with the standard production of thin-layer packaging, and does not necessarily make use of a temporary handle.

To achieve this, the present invention proposes a method of encapsulating at least one microcomponent positioned on a first face of a substrate and/or in the substrate, including at least the following steps:

a) production of at least one electrical contact pad on the first face of the substrate, b) production of at least one portion of sacrificial material covering at least the microcomponent and at least a part of the electrical contact pad, c) production of at least one thick encapsulation layer covering the portion of sacrificial material, and at least a part of the first face of the substrate, d) production, through a second face, opposite the first face, of the substrate, of at least one first hole aligned at least partially with the electrical contact pad, and emerging at the portion of sacrificial material, e) elimination of the portion of sacrificial material through the first hole, f) production, at least in the first hole, of at least one portion of electrically conductive material electrically connected to the electrical contact pad, forming a first conductive via.

A method of encapsulating at least one microcomponent positioned on a first face of a substrate and/or in the substrate is also proposed, including at least the following steps:

a) production of at least one electrical contact pad on the first face of the substrate, b) production of at least one portion of sacrificial material covering at least the microcomponent, c) production of at least one thick encapsulation layer covering the portion of sacrificial material, and at least a part of the first face of the substrate, d) production, through a second face, opposite the first face, of the substrate, of at least one connection hole, or via, aligned at least partially with the electrical contact pad, and at least one release hole, or via, emerging at the portion of sacrificial material, e) elimination of the portion of sacrificial material through the release hole, f) production, at least in the connection hole, of at least one portion of electrically conductive material electrically connected to the electrical contact pad.

The expression "thick layer" in this case designates a layer of material greater than or equal to approximately 100 µm thick, for example a layer made from an overmoulded epoxy compound.

The back-end operations, such as cutting the substrate or overmoulding the microcomponent (or packaging it) are implemented at the substrate, for example in collective fashion for several microcomponents produced on the substrate, while the sacrificial material covering the microcomponent is still present. The sacrificial material covering the microcomponent is removed only after these back-end steps are implemented.

The invention enables the microcomponent to be connected and the structure to be released from the rear face, through the same hole.

According to the invention the microcomponent can therefore be encapsulated directly by the thick encapsulation layer, which forms the overmoulding layer, covering the portion of sacrificial material. There is therefore no requirement to produce a cap before overmoulding the microcomponent.

The component obtained, which is a chip including the microcomponent, and which is obtained after cutting the substrate, may be usable directly, to transfer the component on to an electronic card or printed circuit.

In addition, unlike encapsulation by transferring a cap, the method of encapsulation according to the invention leads to no loss of area on the substrate.

The method may also include, after step e) of elimination of the portion of sacrificial material, a step of plugging the first hole.

The portion of sacrificial material covers at least a part of the electrical contact pad, and the connection hole is the same as the release hole.

The first hole, or via, enabling the portion of sacrificial material to be eliminated, is also used as an electrical contact via in order to form an electrical entry point from the rear face of the substrate to the electrical contact pad, where this entry point was previously used to eliminate the sacrificial material in order to release the microcomponent.

In this case, the method may also include, when the portion of electrically conductive material electrically connected to the electrical contact pad does not plug the first hole, a deposition on and/or in the first hole of a dielectric material plugging the first hole.

The electrical contact pad may also include at least one portion of electrically conductive material surrounding at least one empty space, where the first hole may be aligned with the empty space.

The portion of electrically conductive material may be shaped, in a plane parallel to the first face of the substrate, liked a ring.

Step c) may be obtained by deposition of a resin of the polymer type forming the thick encapsulation layer. The thick encapsulation layer is therefore made from an overmoulding product which may be deposited by injection on the portion of sacrificial material, without degrading the microcomponent.

In one variant, step c) may be obtained:
by cutting a portion of the substrate against which the microcomponent, the electrical contact pad and the portion of sacrificial material are positioned, followed by
positioning said portion of the substrate, the microcomponent, the electrical contact pad and the portion of sacrificial material in a slot formed in at least one second substrate forming the thick encapsulation layer.

The encapsulation method may also include a thinning, after step c), i.e. after one of steps c), d) or e), of the substrate at its second face.

The encapsulation method may also include implementation, after step c), i.e. after one of steps c), d), e) or f), of a step of secure attachment of the thick encapsulation layer to at least one second substrate. This second substrate may thus temporarily form a mechanical handle enabling the mechanical properties of the produced assembly to be improved. Use of such a temporary mechanical handle may be advantageous when the substrate is thinned and/or when the thick encapsulation layer is not sufficiently robust compared to the other elements.

The encapsulation method may also include implementation, between steps b) and c), of a step of deposition of at least one intermediate layer made from at least one dielectric mineral material and/or at least one electrically conductive material covering the portion of sacrificial material, where the thick encapsulation layer covers at least the intermediate layer.

The intermediate layer or layers positioned in this manner between the portion of sacrificial material and the thick encapsulation layer thus protect the microcomponent by forming a part of the microcomponent's encapsulation structure. In addition, by choosing materials which are appropriate for this or these intermediate layer(s), the latter may improve the etching selectivity of the portion of sacrificial material during implementation of step d), given that the etching agent to be used is confronted with the materials of these intermediate layers, which may have better etching selectivity than the material of the thick encapsulation layer.

The electrically conductive intermediate layer positioned between the thick encapsulation layer and the portion of sacrificial material may also have other functions, such as that of an electromagnetic shield, an element of a switch, a getter element absorbing and/or adsorbing the gases present in the cavity after the portion of sacrificial material has been etched.

In addition, by positioning such an intermediate protective layer between the portion of sacrificial material and the thick encapsulation layer, the microcomponent may therefore be encapsulated in a vacuum or in a controlled atmosphere.

When the portion of sacrificial material is covered by the intermediate layer made of electrically conductive material, at least one portion of electrically conductive material may be positioned on the second face of the substrate and connected electrically to the intermediate layer through at least one second hole made through the second face of the substrate, and emerging at the intermediate layer.

The encapsulation method may also include implementation, before step c), i.e. before one of steps a), b) or c), of a step of making scribe lines in the substrate and, after step c), i.e. after one of steps c), d), e) or f), of a step of cutting the substrate according to the scribe lines. These scribe lines may enable the different chips produced on the substrate to be delimited.

The encapsulation method may also involve making at least one additional conductive via, for example called the second conductive via, through implementation of the following steps:
  making at least one additional hole, for example called the third hole, through the substrate,
  production, in said additional hole, of at least one portion of electrically conductive material extending in said additional hole through the substrate, such that at least one remaining empty space of said additional hole extending through the substrate is able to form a zone in which a fluid can flow.

By making such an additional conductive via in an electronic component, a component is obtained the structure of which allows efficient heat evacuation, whilst improving the component's overall gain in area, and therefore the electronic component's integration density, due to the double role of electrical conduction and heat dissipation played by this or these additional conductive vias.

Indeed, the empty space formed within the conductive via itself enables a coolant to be made to flow in and/or through the component, by this means preventing the formation and persistence of hot points in the electronic component, and making the temperature in the electronic component uniform.

In such an electronic component the conductive via therefore has both an electrical conduction function, due to the portion of electrically conductive material able to be used for transmitting signals from one end to the other of the component (for example a transmission of signals between the front and rear faces of the electronic component), but also a function of heat dissipation, due to the empty space enabling a coolant to flow, in order to evacuate the heat outside the electronic component.

In addition, such a conductive via structure does not impose any constraint on the dimensions of the conductive via.

Such an electronic component structure also enables the encumbrance relating to the heat dissipation function to be reduced compared to a component making use of a structure dedicated solely to heat dissipation. Such a gain in area of the component therefore leads to a gain in terms of the cost of the component.

In addition, by combining the functions of electrical conduction and heat dissipation within the conductive via, the heat dissipation achieved is improved due to the closer proximity between the zone in which a fluid can flow and the hot source(s) of the electronic component when they are located in proximity to the conductive vias.

The portion of electrically conductive material of the first conductive via may be such that at least one remaining empty space of the first hole extending through the substrate is able to form a zone in which a fluid can flow. Thus, in addition to the electrical conduction and microcomponent release functions, the first conductive via may therefore also be used as a heat dissipation via due to the empty space present in the conductive via.

The electrically conductive material of the first and/or the additional conductive via may have a thermal conductivity coefficient greater than approximately 50 $W \cdot m^{-1} \cdot K^{-1}$. Thus, the electrically conductive material of the via also contributes to dissipating the heat within the component, given that the coolant is intended to flow in proximity to the electrically conductive material.

Production of the portion of electrically conductive material of the first conductive via and/or of the portion of electrically conductive material of the additional conductive via may include deposition of a layer of electrically conductive material against at least a part of the side walls of the first hole and/or of the additional hole.

The encapsulation method may also include, prior to the deposition of the layer of electrically conductive material, a step of deposition of a first layer of dielectric material against the side walls of the first hole and/or of the additional hole, where said layer of electrically conductive material may be deposited against the first layer of dielectric material, and/or may also include a step of deposition of a second layer of dielectric material against the layer of electrically conductive material.

The invention also relates to a method of producing an electronic device, including at least the implementation of a method of encapsulation of a microcomponent as described above, and secure attachment of the substrate on a support.

The production method may also include the production of at least one fluid flow channel in the support, and the coupling of said fluid flow channel with at least one fluid flow zone formed through the substrate.

The production method may also include the superposition of multiple electronic components the production of which includes at least the implementation of one method of encapsulation of a microcomponent as described above, one on top of another, and the coupling of the fluid flow zones of said electronic components to one another.

BRIEF DESCRIPTION OF THE ILLUSTRATIONS

Figure 9:
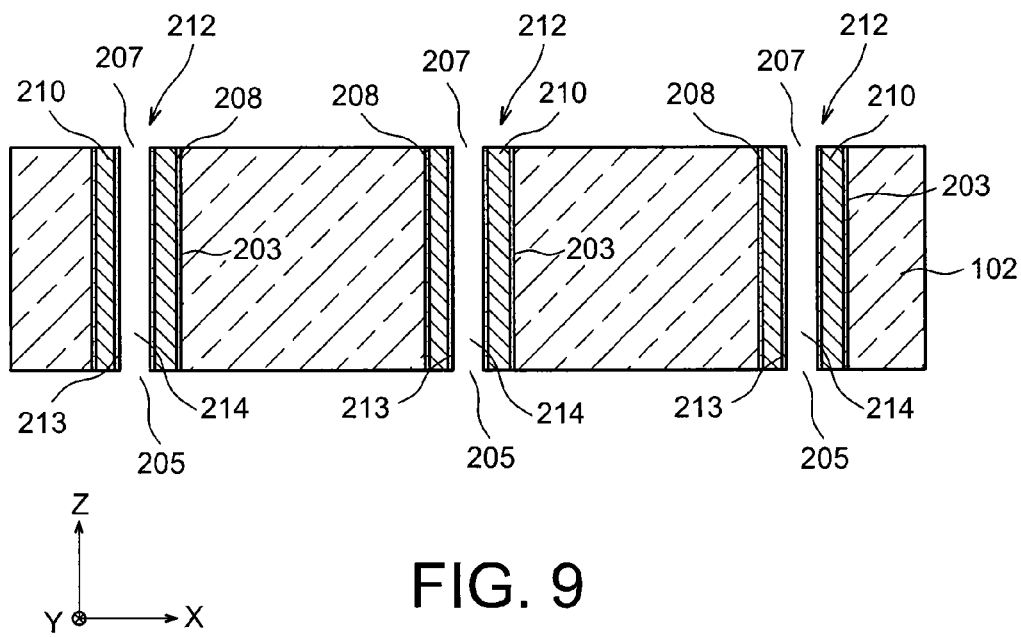
Figure 10A:
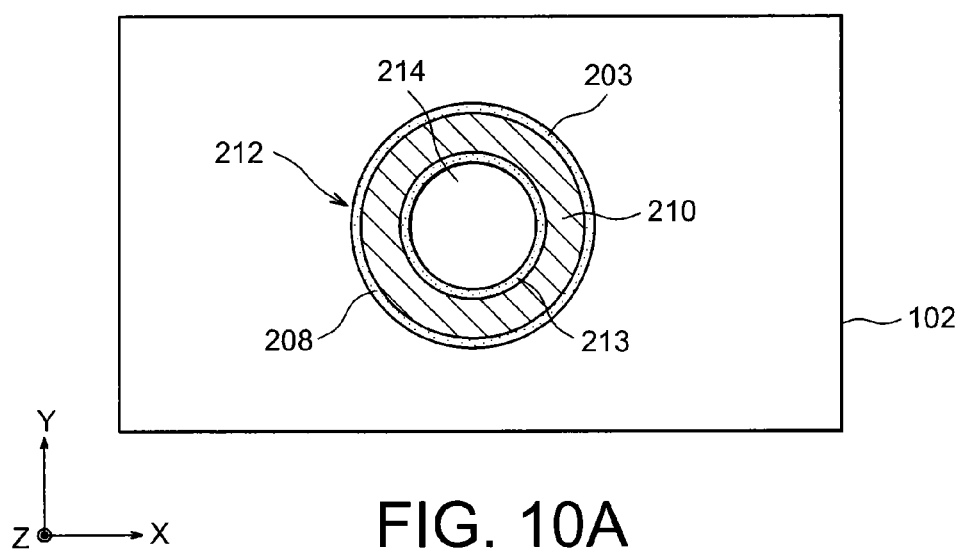
Figure 10B:
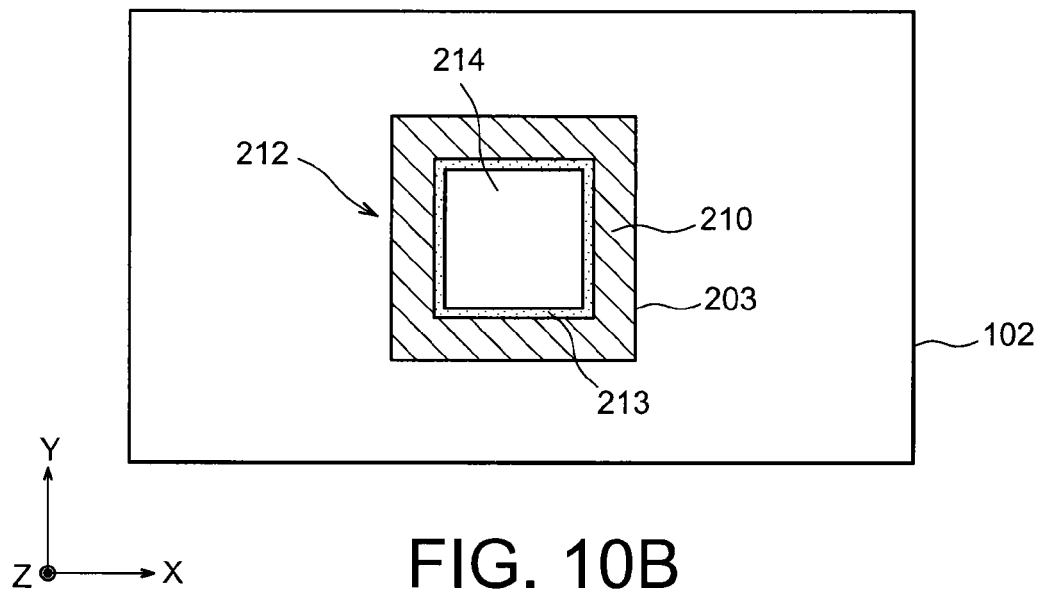
Figure 10C:
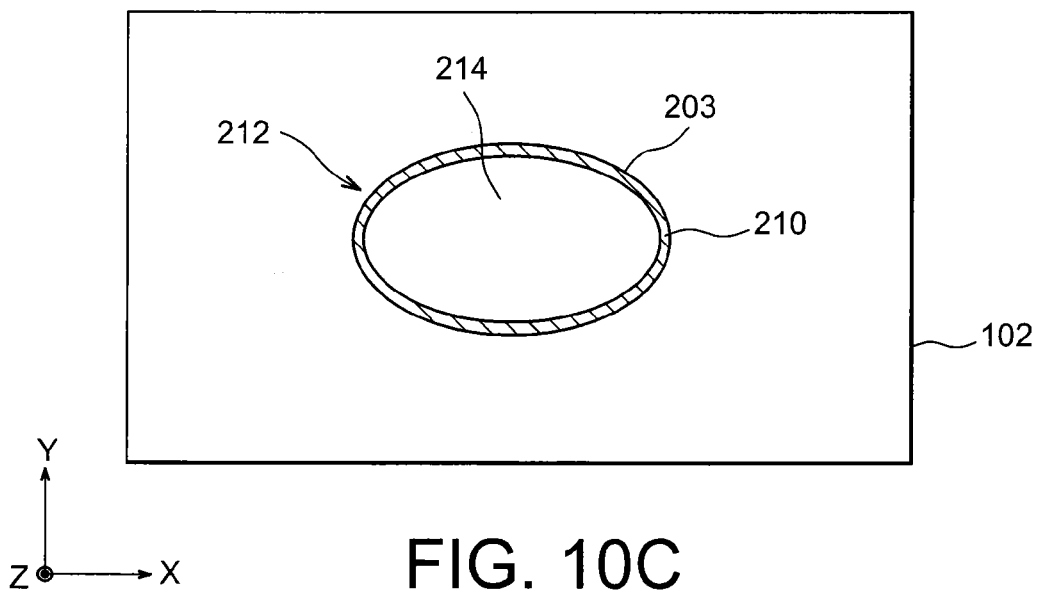
Figure 10D:
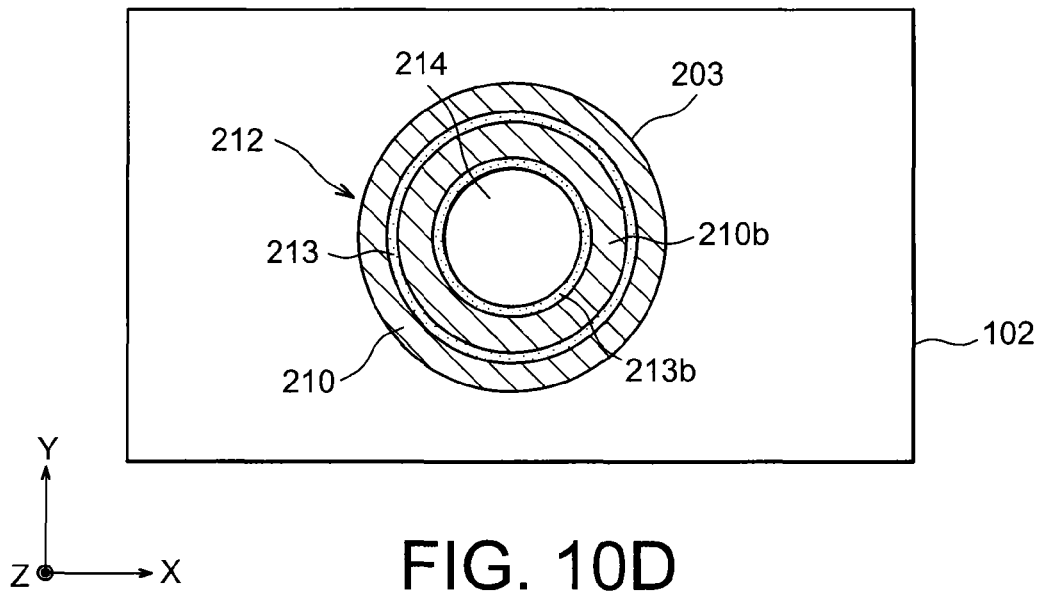
Figure 10E:
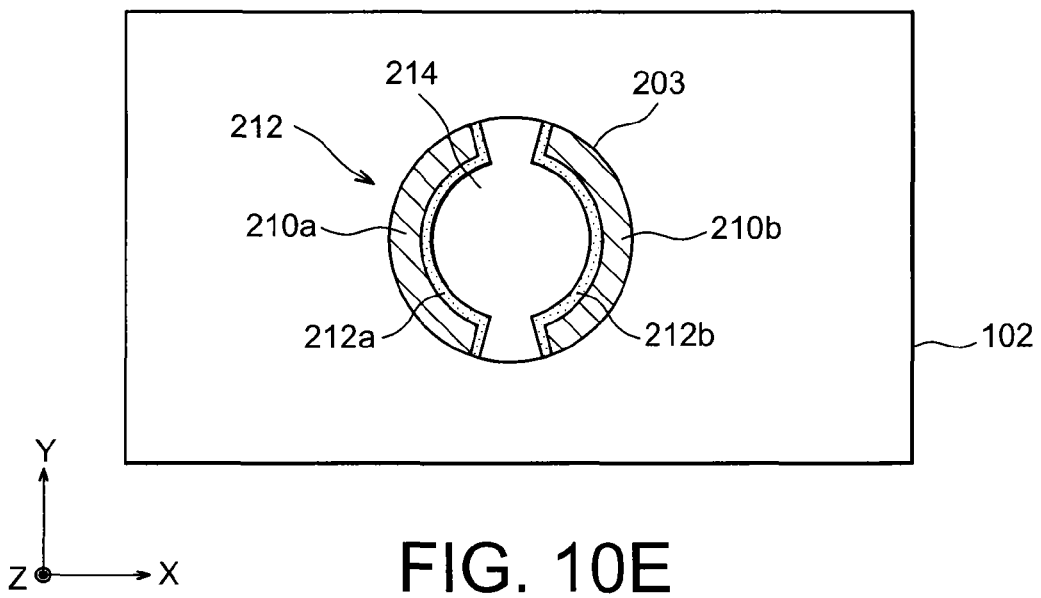
Figure 10F:
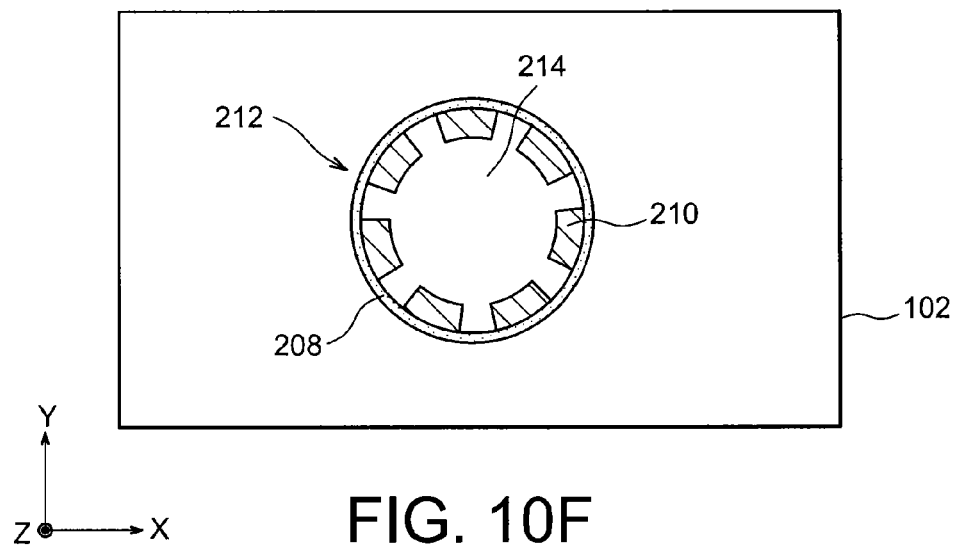
Figure 11:
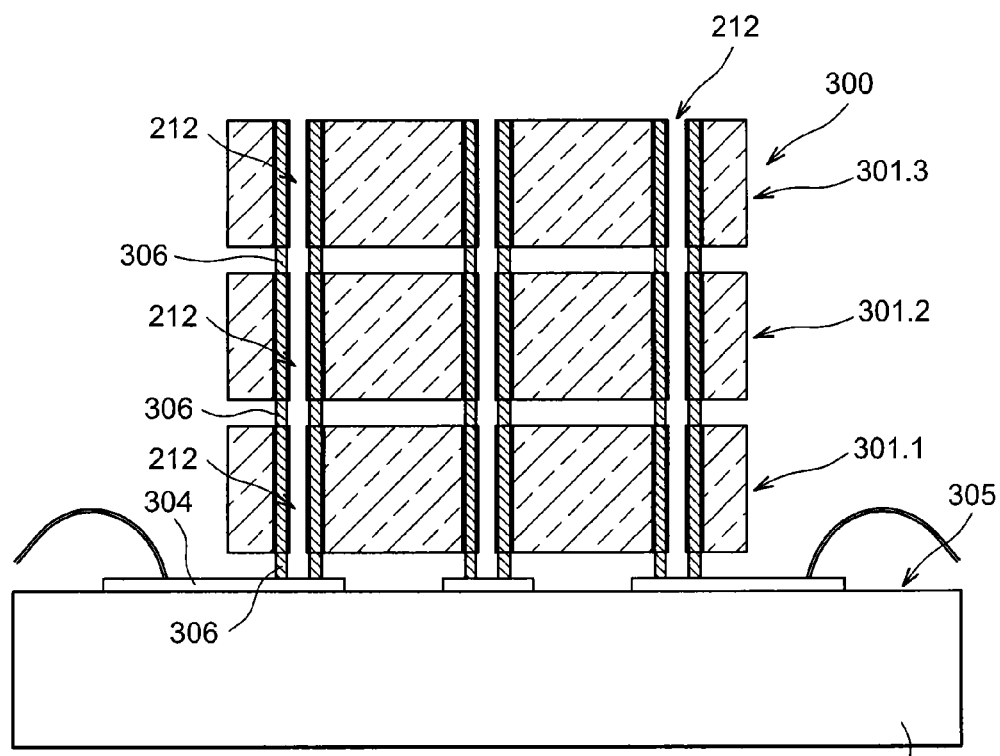
Figure 12:
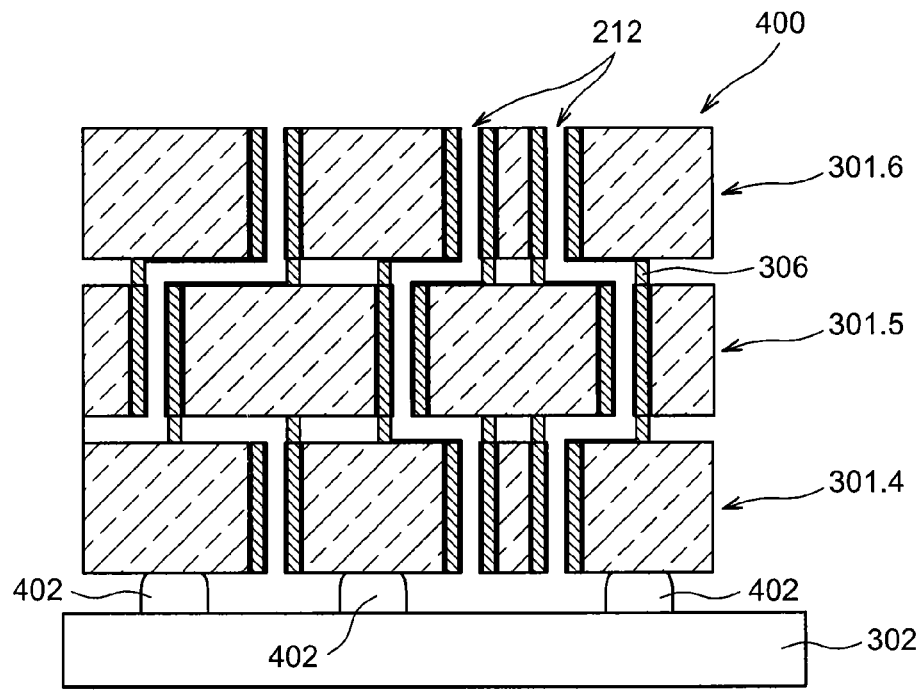
Figure 13:
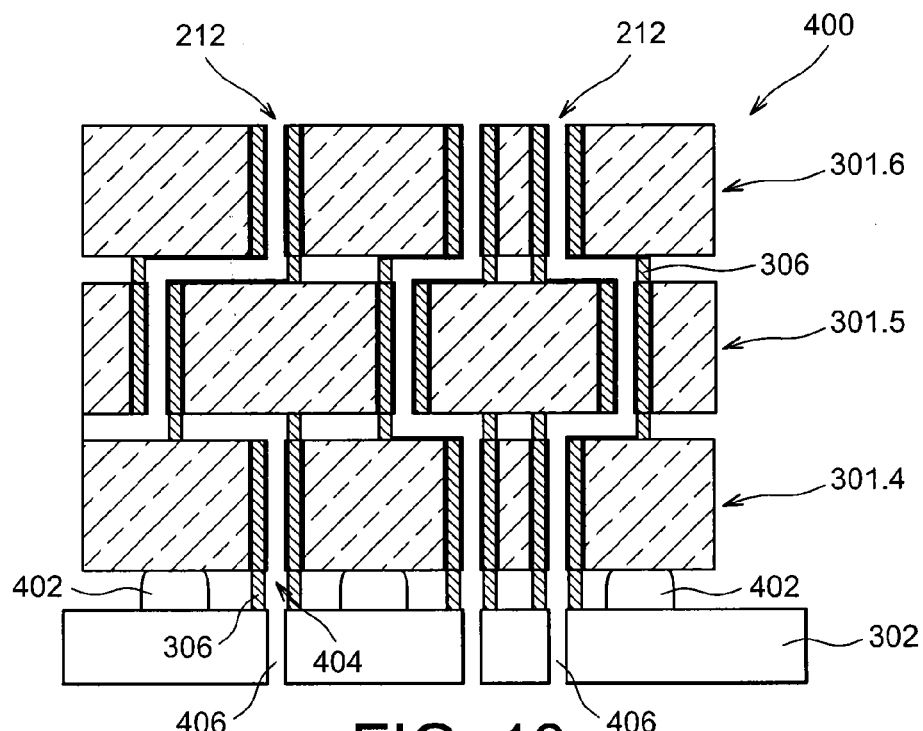
Figure 14A:
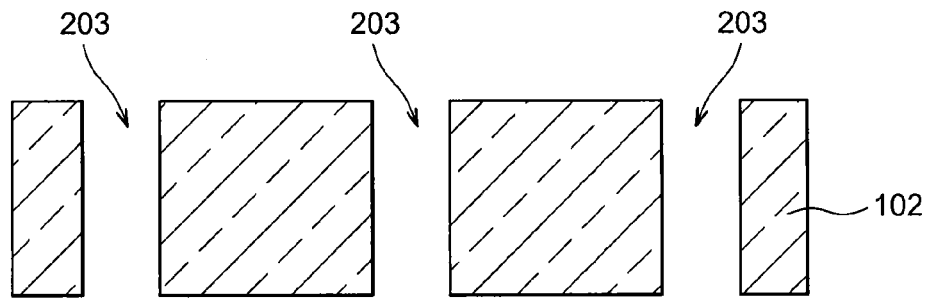
Figure 14B:
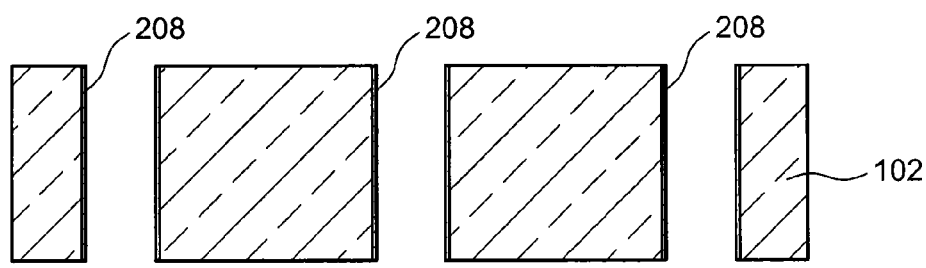
Figure 14C:
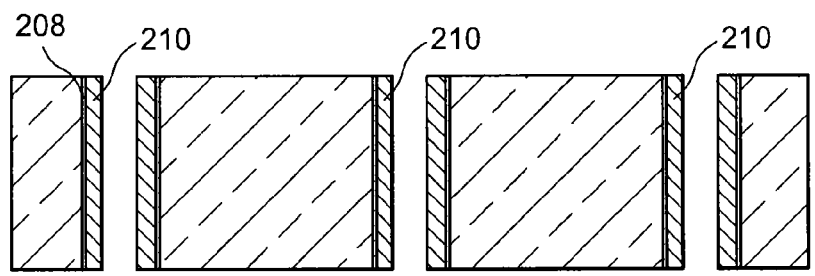
Figure 14D:
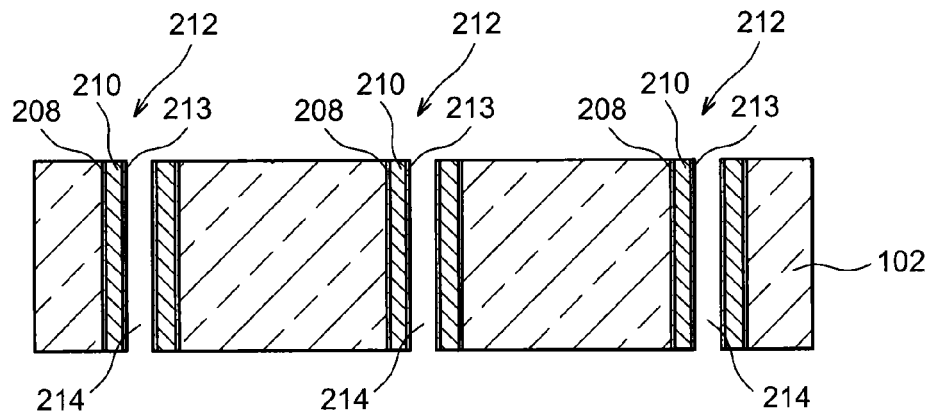
Figure 14E:
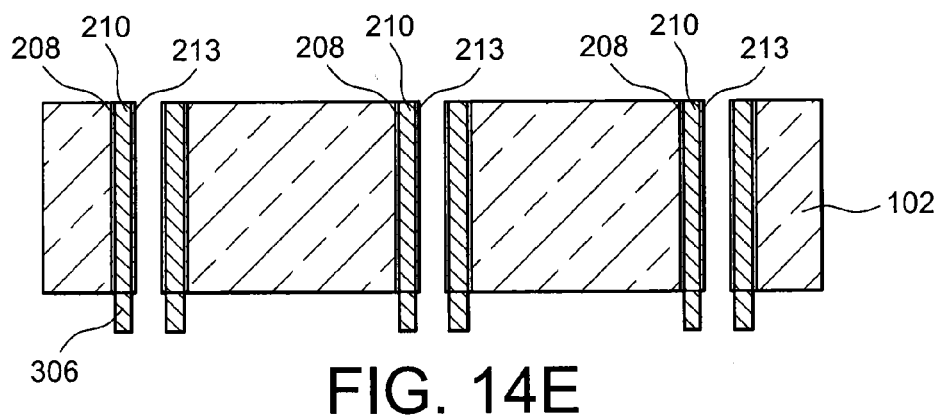
Figure 14F:
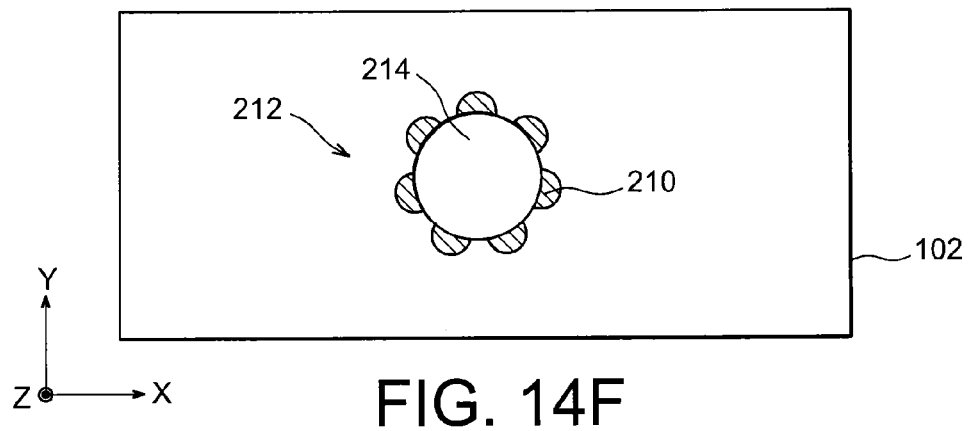
Figure 15:
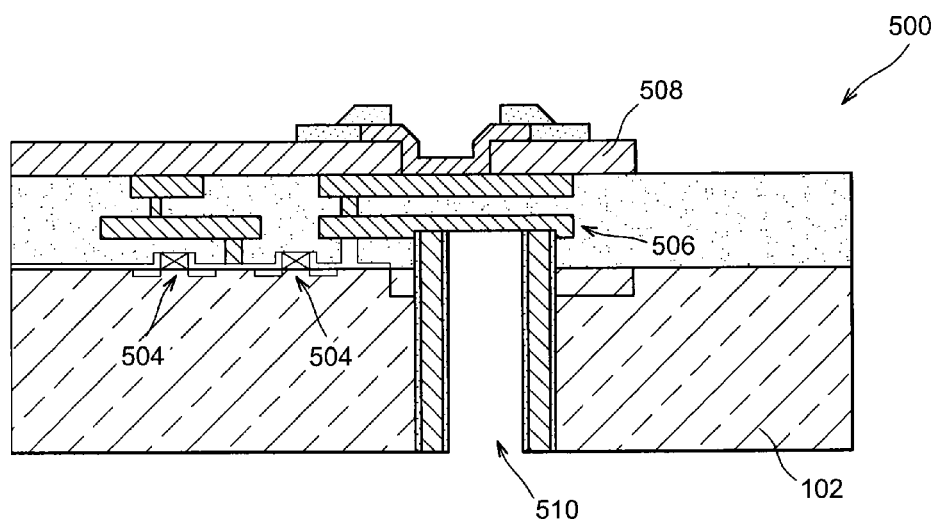
Figure 16:
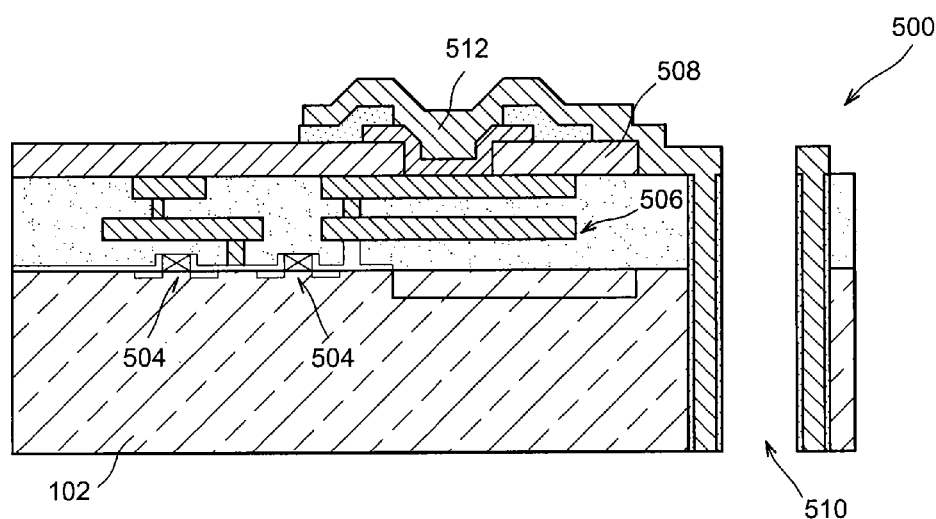
Figure 17:
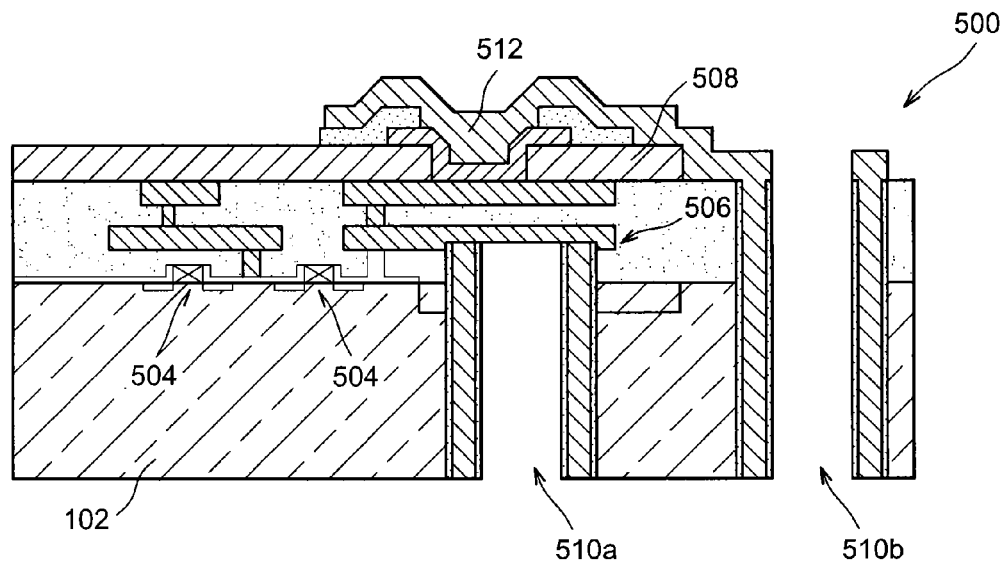
Figure 18:
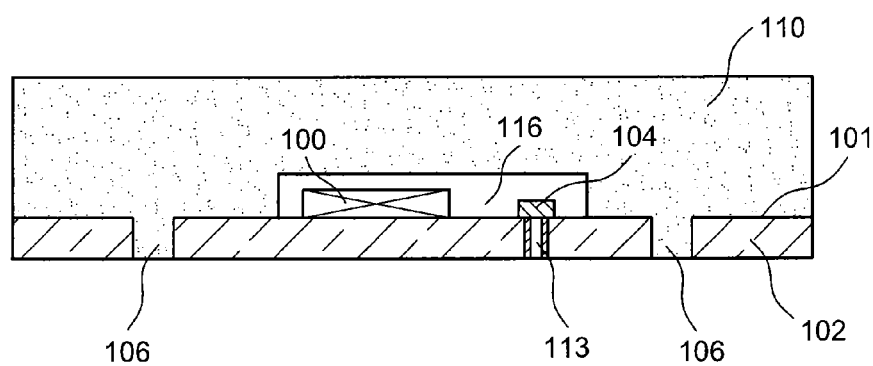

The present invention will be better understood on reading the description of example embodiments given purely as an indication and in no sense restrictively, making reference to the appended illustrations in which:

FIGS. 1A to 1K represent the steps of a method of encapsulating a microcomponent, object of the present invention, according to a first embodiment, FIGS. 2 to 6 represent steps of a method of encapsulating a microcomponent, object of the present invention, according to several variants of the first embodiment, FIGS. 7A to 7I represent steps of a method of encapsulating a microcomponent, object of the present invention, according to a second embodiment, FIGS. 8A to 8D represent steps of a method of encapsulating a microcomponent, object of the present invention, according to a third embodiment, FIGS. 9 and 10A to 10F represent conductive vias having electrical conduction and heat dissipation functions, FIGS. 11 to 13 represent electronic devices which are objects of the present invention, according to different embodiments, FIGS. 14A to 14F represent steps to make conductive vias performing the electrical conduction and heat dissipation functions, FIGS. 15 to 17 represent electronic components including one or more microcomponents encapsulated according to a method, object of the present invention, FIG. 18 represents a microcomponent encapsulated according to a method, object of the present invention.

Identical, similar or equivalent parts of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED DESCRIPTION OF PARTICULAR EMBODIMENTS

Reference is firstly made to FIGS. 1A to 1J, which represent the steps of a method of encapsulating a microcomponent 100 according to a first embodiment.

As represented in FIG. 1A, microcomponent 100, for example in this case a device of the MEMS type, is produced on a front face 101 of a substrate 102. Substrate 102 is, for example, made of silicon, and in this case is approximately 700 μm thick. One or more electrical contact pads 104, whether or not connected to microcomponent 100, are also present on front face 101 of substrate 102. In FIG. 1A a single electrical contact pad 104 is present on face 101 of substrate 102.

Figure 1B:
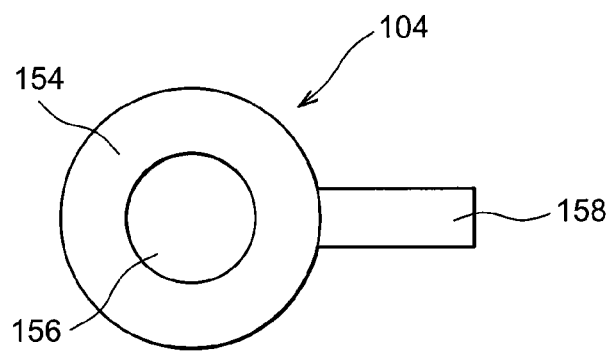

In this first embodiment, electrical contact pad 104 in this case has a particular shape, called a "corolla" shape. Indeed, as represented in FIG. 1B, electrical contact pad 104 includes an electrically conductive part 154, for example made of metal, surrounding an empty part 156. Electrically conductive part 154 is in this case shaped like a ring or a crown. In addition, electrical contact pad 104 in this case includes a portion of electrically conductive material 158 electrically connecting ring-shaped conductive part 154 to microcomponent 100.

Figure 1C:
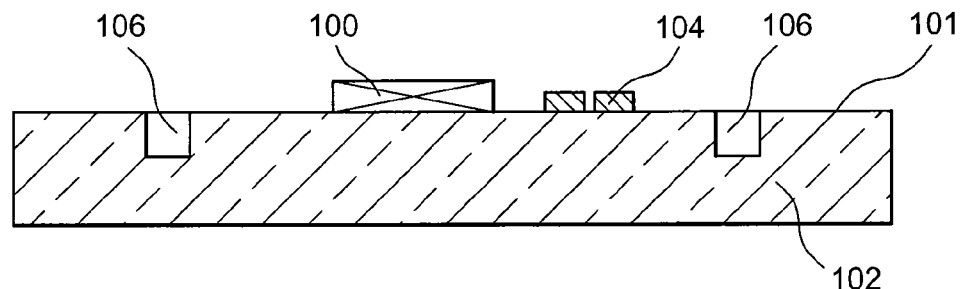

Scribe lines 106 of substrate 102 delimiting the different chips intended to be produced on substrate 102 (one of which comprises microcomponent 100) are etched in substrate 102, for example in its front face 101, and to a depth of between approximately 20 μm and 500 μm (FIG. 1C).

Figure 1D:
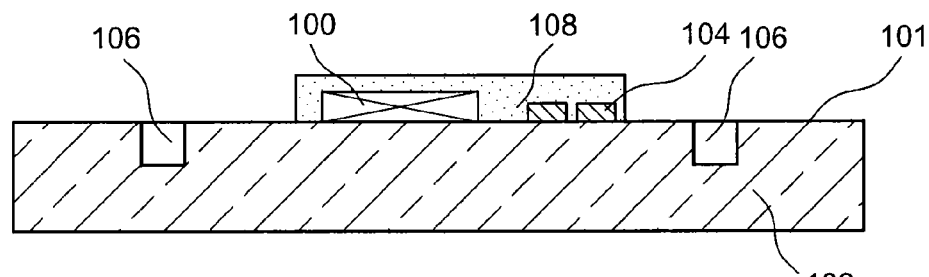

As represented in FIG. 1D, a portion 108 of sacrificial material is then produced on front face 101 of substrate 102 so as to cover microcomponent 100 and electrical contact pad 104. This portion 108 of sacrificial material is obtained, for example, by covering front face 101 of substrate 102 with a layer of the sacrificial material, for example made of a polymer deposited by a spin-on technique, of an organic resin, of a metal or a dielectric, which is then etched in order to obtain portion 108 of sacrificial material intended to occupy roughly the volume of the future cavity in which microcomponent 100 and electrical contact pad 104 are intended to be encapsulated.

In one variant, it is possible for portion 108 of sacrificial material to cover only microcomponent 100 and not electrical contact pad 104.

Figure 1E:
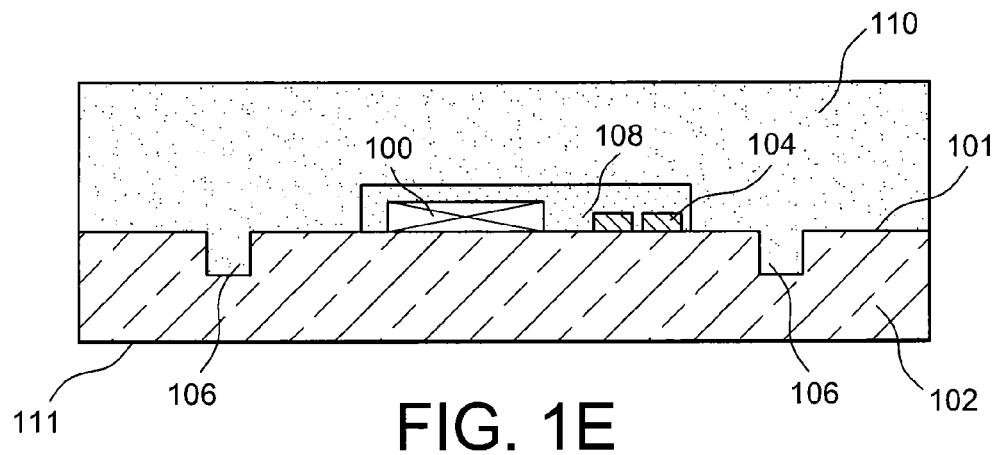

A thick encapsulation layer 110, which is an overmoulding layer, is then deposited on the whole of substrate 102, i.e. on front face 101 of substrate 102, in scribe lines 106 and on portion 108 of sacrificial material (FIG. 1E). This thick encapsulation layer 110 is, for example, more than approximately 100 μm thick, and is made of a resin deposited, for example, by injection, or is made of equivalent materials (epoxy resin, etc.). When electrical contact pad 104 is not covered by sacrificial material 108, thick encapsulation layer 110 covers, and is in contact with, pad 104.

Figure 1F:
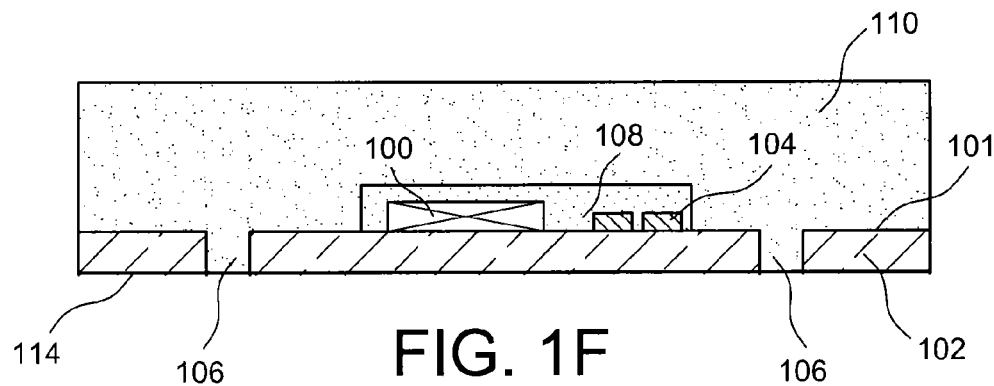

Substrate 102 is then thinned from a rear face 111 opposite front face 101. In the example of FIG. 1F, the thinning is accomplished for example by chemical mechanical polishing, stopping at the material of thick encapsulation layer 110 positioned in scribe lines 106.

Figure 1G:
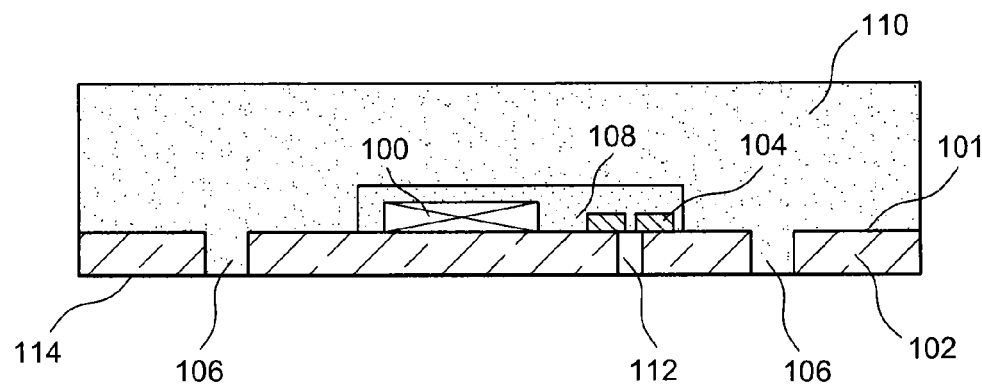

A hole, or through via, 112 is then made through thinned substrate 102, for example by DRIE etching (Deep Reactive Ion Etching) in the material of substrate 102, forming an entry point from a rear face 114 of thinned substrate 102 to portion 108 of sacrificial material, through empty space 156 of electrical contact pad 104 (FIG. 1G).

Hole 112 is aligned with empty part 156 of electrical contact pad 104, and hole 112 thus emerges on the surface of portion 108 of sacrificial material.

This empty part 156 may be produced before depositing sacrificial material 108, or alternatively may be made after hole 112 is formed, by laser etching, through hole 112, of electrical contact pad 104 which, before this laser etching, is a "full" portion of electrically conductive material.

The electrical contact via, or connection hole, i.e. the hole giving electrical access to electrical contact pad 104, and the release via, or release hole, i.e. the hole giving access to portion 108 of sacrificial material in order to etch it, are in this case the same, and are formed by a single hole or via 112.

If portion 108 of sacrificial material does not cover pad 104, the electrical contact via and the release via are not the same. In this case, a through via, or hole, which is not represented, different from via 112, is made through thinned substrate 102 such that it emerges on portion 108 of sacrificial material, thus forming a release via different from the electrical contact via.

Figure 1H:
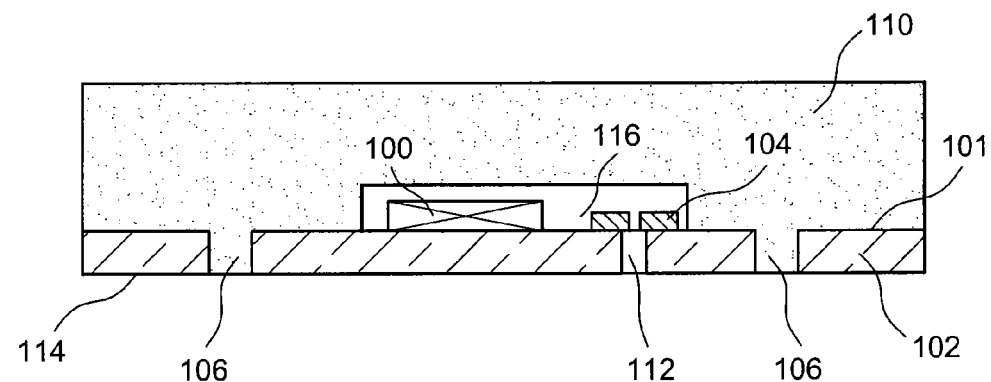

As represented in FIG. 1H, portion 108 of sacrificial material is then etched, for example by plasma etching when the sacrificial material of portion 108 is an organic material, through the release via, which in this case is hole 112, and also through empty space 156 of electrical contact pad 104, forming a cavity 116 in which microcomponent 100 and electrical contact pad 104 are encapsulated.

A deposition, for example of the PECVD type, is then made of a dielectric layer 120 on the side walls of hole 112 and on rear face 114 of thinned substrate 102. During the deposition of dielectric layer 120 the bottom wall of hole 112, which forms an entry point to electrical contact pad 104, is also covered by this dielectric layer 120. This part of dielectric layer 120 covering the bottom wall of hole 112 is thus removed, for example by lithography and etching by anisotropic plasma of this part of dielectric layer 120.

An electrically conductive layer 122, for example made of metal deposited by PVD (physical vapour deposition), and possibly completed by ECD (electrolytic deposition), is then deposited on dielectric layer 120, and also on the bottom wall of hole 112, so as to form an electrical contact with pad 104.

As a variant, the electrical contact with pad 104 may be made by a screen print of an electrically conductive adhesive filling the remaining space of hole 112.

When the electrical contact via is not used as a release via, the electrical contact with pad 104 may be made by deposition of an electrically conductive layer followed by electrolysis, for example of copper.

A passivation layer 124, made from a dielectric material such as a resin, is then deposited, for example by lamination of a film, on the rear face of the previously produced assembly, covering dielectric layer 120 and electrically conductive layer 122.

Figure 1I:
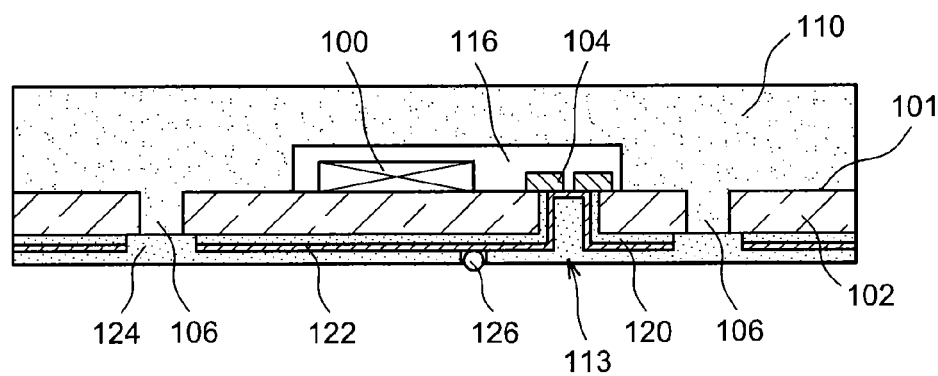

An electrical contact 126 is then formed through passivation layer 124, electrically contacting contact pad 104 through electrically conductive layer 122 (FIG. 1I). A first electrically conductive via 113, made through substrate 102 is thus obtained, which is electrically connected to electrical contact pad 104.

Figure 1J:
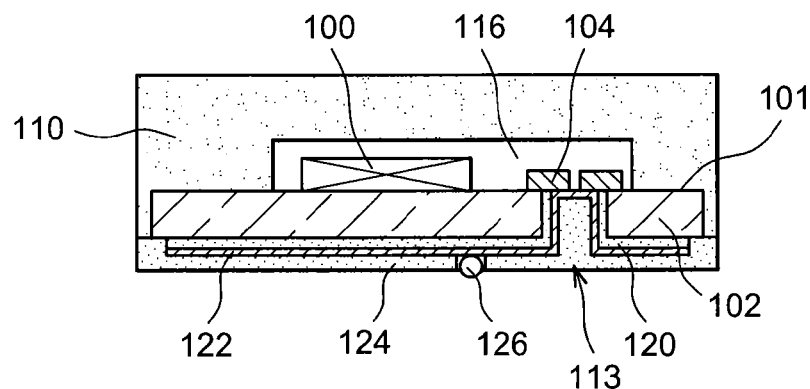

The assembly produced in this manner is then cut along scribe lines 106 made in substrate 102, enabling microcomponent 100 to be obtained in the form of an individual chip ready to be integrated on an electronic card or printed circuit (FIG. 1J).

Figure 1K:
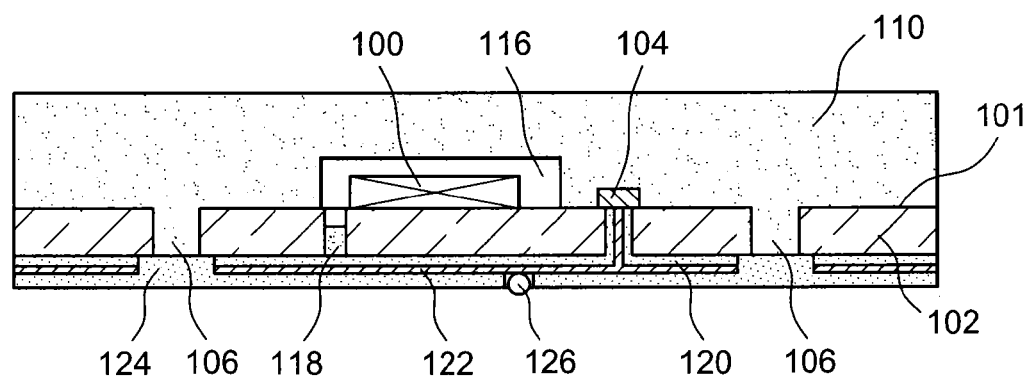

FIG. 1K represents encapsulated microcomponent 100 obtained when the release and connection holes are separate. It can be seen in this figure that electrical contact pad 104 is outside cavity 116. In addition, a portion 118 of dielectric material is plugging the release hole formed through substrate 101. In addition, in this configuration, electrical contact pad 104 has no empty part, and is formed entirely of electrically conductive material.

Figure 2:
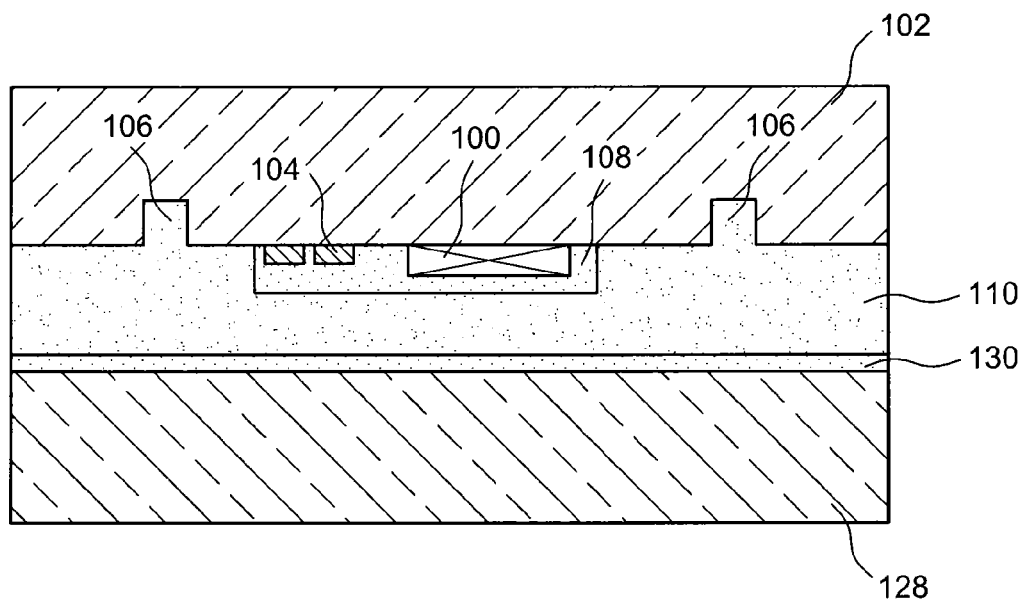

In a variant, for example when thick encapsulation layer 110 does not provide sufficient resistance to substrate 102 after it is thinned, or when the deposition of thick encapsulation layer 110 causes excessive deflection in the produced assembly, it is possible temporarily to transfer all the elements represented in FIG. 1E to a second substrate temporarily acting as a mechanical handle. Thus, as represented in FIG. 2, the upper face of thick encapsulation layer 110 is securely attached to a second substrate 128 through a bonding layer 130. The steps described above in connection with FIGS. 1F to 1J are then implemented in a similar manner. Second substrate 128 may then be detached from layer 110, either after the contact with pad 104 has been made, i.e. between the steps represented in FIGS. 1I and 1J, or alternatively after substrate 102 has been cut, i.e. after the step represented in FIG. 1J.

When microcomponent 100 is an optical or opto-electronic component, for example of the MOEMS type, the material of thick encapsulation layer 110 may be a material which is at least partially transparent to light.

Figure 3:
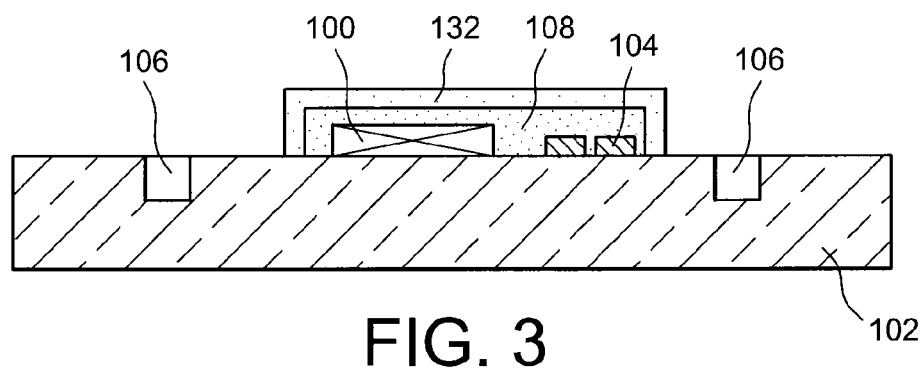

According to another variant, it is also possible, prior to the deposition of thick encapsulation layer 110, to cover portion 108 of sacrificial material with a mineral intermediate layer 132, for example made of $SiO_2$ and/or of SiN, for example deposited by PECVD (see FIG. 3). This variant enables improved etching selectivity of portion 108 of sacrificial material to be obtained, since the material of mineral intermediate layer 132 has an etching selectivity, compared to the sacrificial material of portion 108, which is greater than that obtained by the material of thick encapsulation layer 110.

This variant applies equally when portion 108 of sacrificial material covers electrical contact pad 104 and when it does not cover it.

Figure 4:
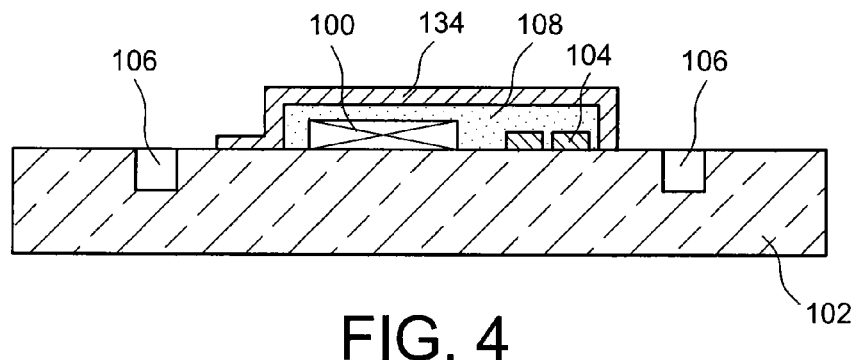

According to another variant, it is also possible, before the deposition of thick encapsulation layer 110, to cover portion 108 of sacrificial material with an electrically conductive intermediate layer 134 as represented in FIG. 4.

This intermediate layer 134, for example made of a metal such as titanium and/or gold and/or nickel and/or copper and/or AlSi, not only enables the etching selectivity of portion 108 of sacrificial material to be improved, but may also have other functions, depending on the nature of the metal material.

Figure 5:
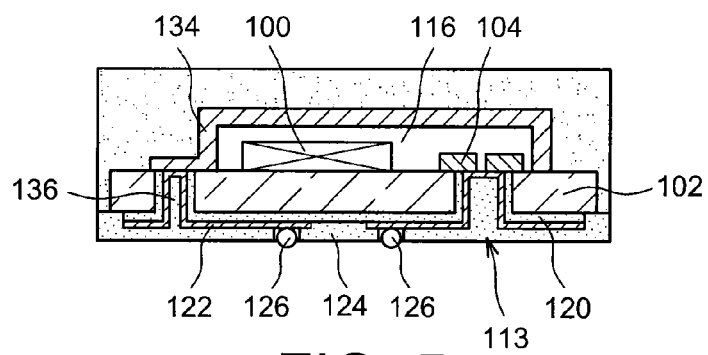
Figure 6:
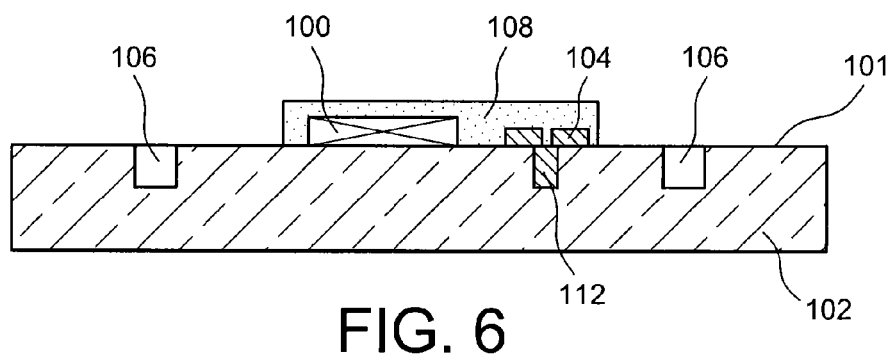

Intermediate layer 134 may thus form, for example, an electromagnetic shield, an element of a switch, or a getter element absorbing and/or adsorbing the gases present in cavity 116 after the etching of portion 108 of sacrificial material. In addition, an electrical contact with this intermediate layer 134 may subsequently be made, as represented in FIG. 5.

To do so, at least one second hole 136 is made through thinned substrate 102 in order to access to a portion of intermediate layer 134. The contact with intermediate layer 134 is made in a manner comparable to that made for electrical contact pad 104 due to dielectric layer 120, to electrically conductive layer 122, and to a second electrical contact 126 deposited in second hole 136. It should be noted that, in this case, electrically conductive layer 122 is interrupted in the area of a portion positioned between two electrical contacts 126 in order that electrical contact pad 104 is not short-circuited with intermediate layer 134.

This variant applies equally when portion 108 of sacrificial material covers electrical contact pad 104 and when it does not cover it.

The variants described above in connection with FIGS. 3 to 5 in which an intermediate layer of material is inserted between portion 108 of sacrificial material and thick encapsulation layer 110 also enable encapsulation of microcomponent 100 to be accomplished in a vacuum or in a controlled atmosphere, bearing in mind the hermeticity which can be obtained in cavity 116 due to the nature of the material of mineral intermediate layer 132 and/or electrically conductive intermediate layer 134. The hole or holes forming an entry point to cavity 116 can be plugged through the use of vacuum deposition, for example angled cathodic evaporation or sputtering, i.e. inclining the plate (substrate 102) during the deposition, which enables the plugging material to be deposited on the sides of the release hole without depositing plugging material in cavity 116.

The encapsulation accomplished in this manner may be made hermetic due to the fact that the materials used to produce mineral intermediate layer 132 and/or electrically conductive intermediate layer 134 and plugging material 118 each has low permeation.

According to another variant, hole 112 may also be made before depositing portion 108 of sacrificial material, and before electrical contact pad 104 is produced. Thus, when electrical contact pad 104 is produced on front face 101 of substrate 102, hole 112, which was previously made in the slot of electrical contact pad 104, is filled with the electrically conductive material forming electrical contact pad 104 (see FIG. 6). The other steps described above in connection with FIGS. 1E to 1J are then implemented. Substrate 102 may be thinned as far as hole 112. However, in order to etch portion 108 of sacrificial material, it is necessary beforehand to eliminate at least partially the electrically conductive material located in hole 112 which is used as the via for releasing microcomponent 100. In addition, hole 112 may be filled by a layer of electrically conductive material covering the side wall of the via, and another material such as silicon may then be deposited in the centre of the via. With such a "ringed" via, the central silicon part may then be eliminated to form an entry point in order to etch portion 108 of sacrificial material.

When the release via is separate from the electrical contact via, only the electrical contact via may be filled with the electrically conductive material.

Reference is made to FIGS. 7A to 7I, which represent the steps of a method of encapsulation of a microcomponent 100 according to a second embodiment.

According to this second embodiment, the steps described above in connection with FIGS. 1A to 1D are firstly accomplished.

Figure 7A:
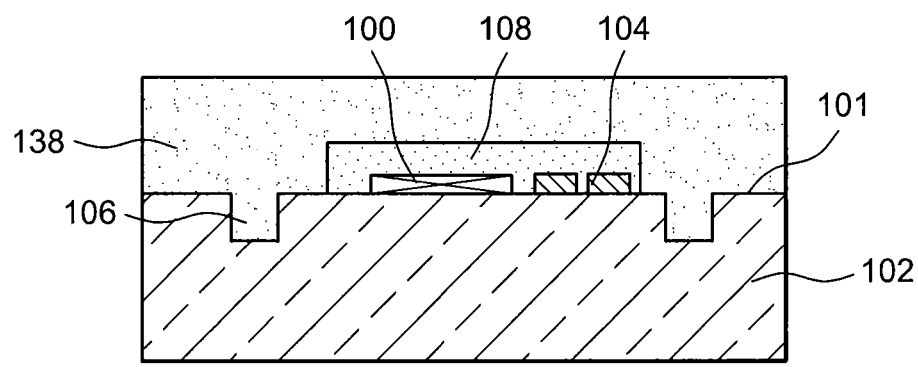

After this, as represented in FIG. 7A, substrate 102 is covered with a thick encapsulation layer 138 made from a composite printed circuit material, for example of the prepreg, RCC (Resin-Coated Copper) type, or a glass fibre reinforced epoxy resin composite (material FR4).

Thick encapsulation layer 138 may then include an epoxy resin, whether or not combined with a copper sheet, and may be formed, for example, by pressing on front face 101 of substrate 102, in scribe lines 106 and on portion 108 of sacrificial material. To prevent excessive deflection of the produced assembly, all the elements represented in FIG. 7A is temporarily transferred to a second substrate temporarily acting as a mechanical handle.

Figure 7B:
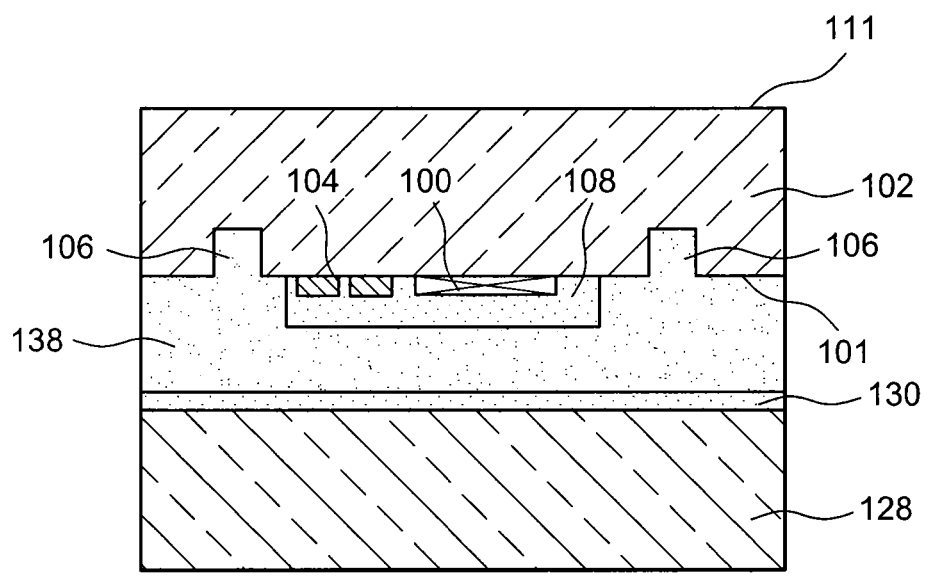

Thus, as represented in FIG. 7B, the upper face of layer 138 is securely attached to a second substrate 128 through a bonding layer 130, in a manner comparable to the variant described in connection with FIG. 2.

Figure 7C:
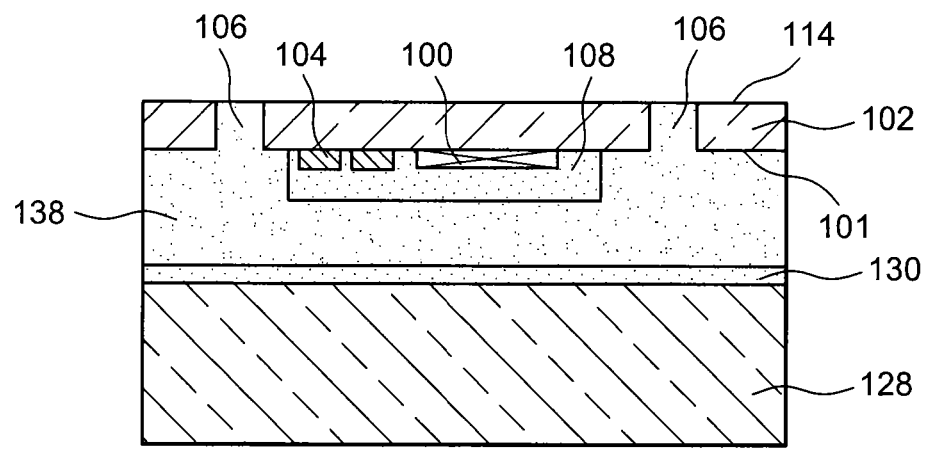

Substrate 102 is then thinned from its rear face 111 opposite front face 101, for example by chemical mechanical polishing, stopping at the material of layer 138 positioned in scribe lines 106 (FIG. 7C).

Figure 7D:
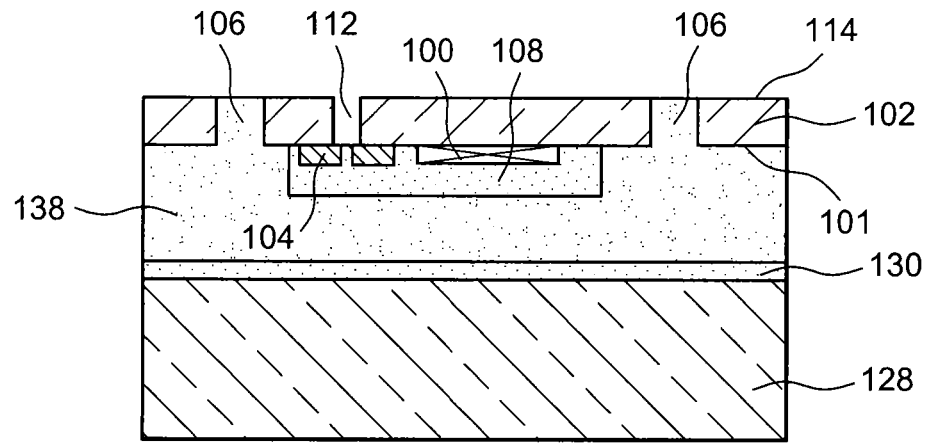

A through via, or hole, 112 is then made through thinned substrate 102, forming an entry point from rear face 114 of thinned substrate 102 to electrical contact pad 104, and to portion 108 of sacrificial material through the empty part of electrical contact pad 104 (FIG. 7D).

Figure 7E:
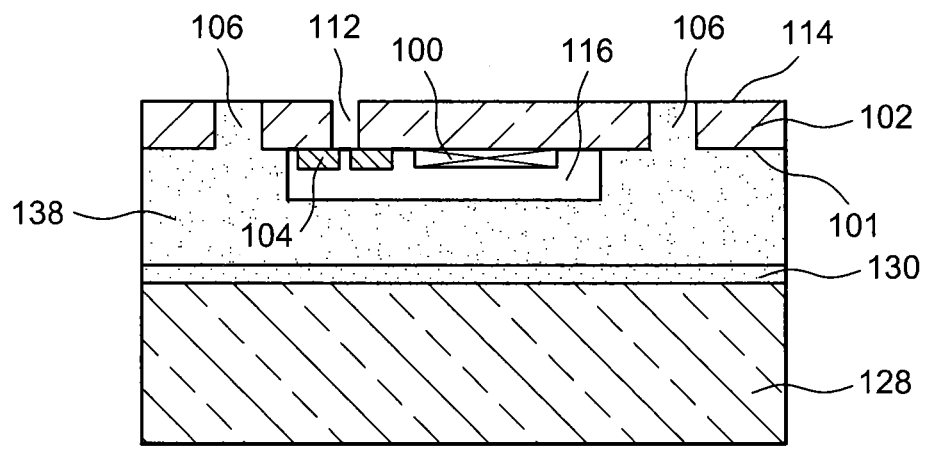

As represented in FIG. 7E, portion 108 of sacrificial material is then etched, for example by plasma etching, when the sacrificial material of portion 108 is an organic material, through hole 112 and electrical contact pad 104, forming a cavity 116 in which microcomponent 100 is encapsulated.

Figure 7F:
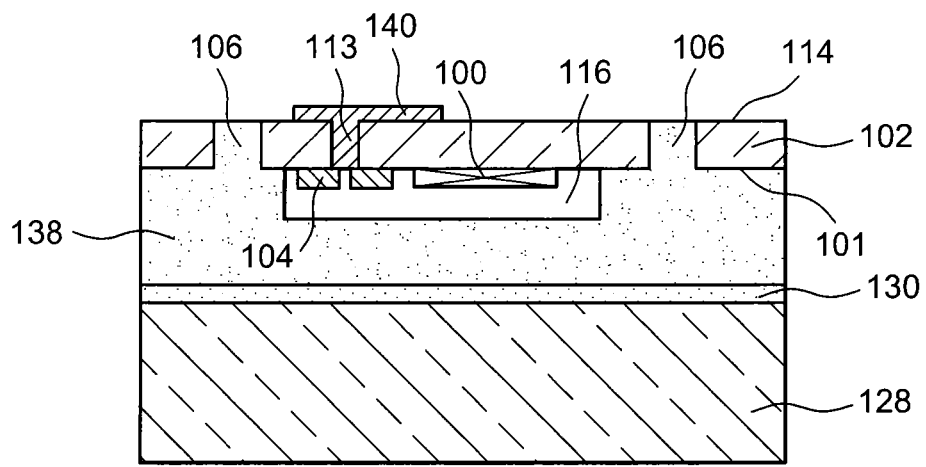

An electrical contact is then made by filling hole 112 with an electrically conductive material, for example by screen printing a conductive polymer, forming an electrical contact 140 in rear face 114 of thinned substrate 102 electrically connected to electrical contact 104 by conductive via 113 (FIG. 7F).

Figure 7G:
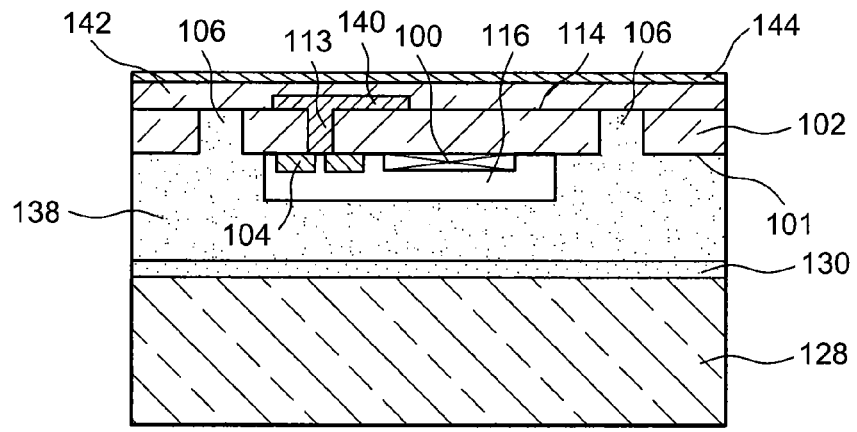
Figure 7H:
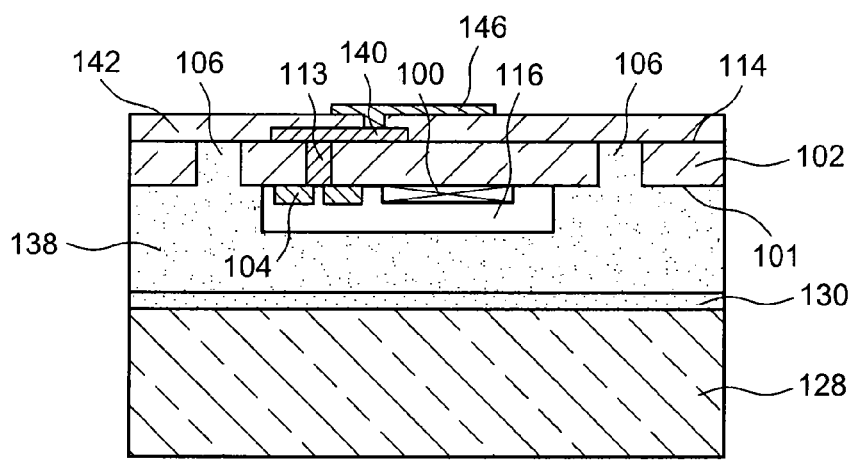

As represented in FIG. 7G, rear face 114 of thinned substrate 102 is covered with a composite bilayer formed by a layer 142 which may be made from a material similar to that of thick encapsulation layer 138, for example epoxy resin, and by a layer 144 made of an electrically conductive material, for example copper.

This composite bilayer also covers electrical contact 140.

Layer 144 is then etched. A remaining portion 146 of layer 144 is then electrically connected, for example through a metallised via formed through layer 142, to electrical contact 140.

Figure 7I:
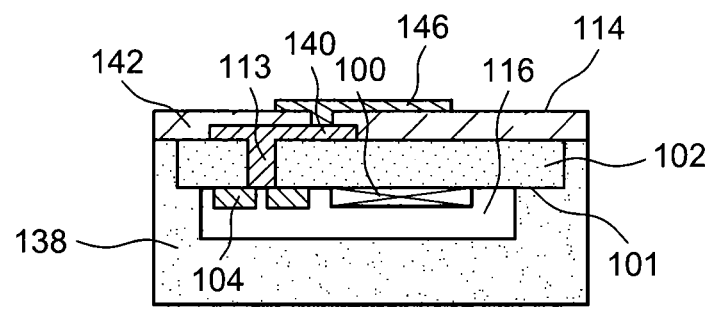

Second substrate 128 and bonding layer 130 are then eliminated. The assembly produced in this manner is then cut along scribe lines 106 made in substrate 102, enabling microcomponent 100 to be obtained in the form of an individual chip ready to be integrated on an electronic card (FIG. 7I). In addition, bearing in mind the materials used to form layer 138 and layer 142, which are materials used to produce the printed circuits, the chip obtained forms a part of a printed circuit which does not require that pre-packaging steps are implemented before it is integrated in a printed circuit.

The variants described above in connection with the first embodiment can also be applied to this second embodiment. In addition, it is also possible that the via used to etch portion 108 of sacrificial material and the via electrically connected to pad 104 are separate and not the same.

FIGS. 8A to 8D represent the steps of a method of encapsulation of a microcomponent 100 according to a third embodiment. This third embodiment includes the use of rebuild wafer techniques.

Figure 8A:
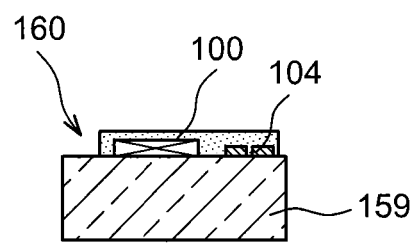

The steps described above in connection with FIGS. 1A to 1D are implemented in order to cover microcomponent 100, and possibly electrical contact pad 104, by portion 108 of sacrificial material, which is for example made of an organic material. Chips 160, one of which comprises microcomponent 100, are then separated by cutting substrate 102, where each chip 160 includes a portion 159 of substrate 102 (FIG. 8A).

Each individual chip 160 of which the microcomponent and possibly the electrical contact pad are protected by a portion 108 of sacrificial material is then transferred to a preform, for example made of an injected polymer, and the dimensions of which match those of a substrate, or again in a substrate 162 with several slots in which chips 160 are positioned, and held in place by a bonding material 164 such as adhesive placed in the slots (FIG. 8B).

The portions of substrate 162 located opposite chips 160 are more than or equal to approximately 100 μm thick.

Bonding material 164 is then polymerised, and after this a front face 166 of substrate 162 is thinned. If chips 160 protrude beyond front face 166 of substrate 162, as is the case in the example represented in FIG. 8B, it is the portions of substrate 102 of chips 160 which protrude from front face 166 of substrate 162 which are thinned (FIG. 8C). However, if it is the portions of substrate 162 which are located between chips 160 which protrude and form a relief relative to chips 160, it is then the portions of substrate 162 which are thinned.

The other steps of encapsulation of the microcomponents of chips 160 which are implemented are the other steps described above for the other embodiments such as, for example, the steps described above in connection with FIGS. 1G to 1J.

When the microcomponents of chips 160 are optical or opto-electronic devices, portions 168 of an optically transparent material, for example one made of glass, may be installed at a rear face 167 of substrate 162, at the bottom of the slots intended to receive chips 160 (FIG. 8D).

In all the embodiments described above, the electrical contact pad includes a portion of electrically conductive material surrounding an empty part, where said empty part forms, with a hole, or a through via, made from the rear face of the substrate, an entry point to a portion of sacrificial material intended to be etched to release the microcomponent.

In the embodiments in which the holes of the conductive vias are not completely plugged they may also have a heat dissipation function. In this case at least two holes may be made. These holes then have a triple function: electrical, thermal and release.

The shape of the electrical contact pad may be different.

When the release via and the electrical conduction via are separate, the electrical contact pad may be merely a portion of electrically conductive material which does not contain an empty part, given that in this case the electrical contact pad does not participate in forming an entry point to the portion of sacrificial material.

In addition, the section of the electrical contact pad or pads may be different to that represented in FIG. 1B, for example a rectangular, oval, or any other shape. Finally, the empty part of the electrical contact pad may be formed after the formation of the connection via, by eliminating a part of the contact pad.

In all the embodiments described above, it is possible for one or more electrically conductive vias to be made through substrate 102, for example next to cavity 116, in which microcomponent 100 is encapsulated, in order to perform a function of electrical connection with other elements. In this case, at least some of these conductive vias may also have a heat dissipation function.

FIGS. 9 and 10A represent respectively a side section view and a top view of such connection holes, or conductive vias, 212, or TSV (Through Silicon Vias), performing simultaneously an electrical conduction function (or electrical signal transfer function), and a function of cooling, or dissipating the heat of, the component of which substrate 102 forms a part.

Conductive vias 212 come through substrate 102 from its front face to its rear face. Each of conductive vias 212 therefore extends from a first end 205 located at the rear face of substrate 102 to a second end 207 located at the front face of substrate 102.

In this case conductive vias 212 are roughly cylindrical in shape. The dimensions of the conductive vias, and in particular their diameters, will be dependent on the technology used to produce them, and is, for example, between approximately 1 μm and several hundred μm.

Each conductive via 212 is made from a hole 203 which comes through substrate 102 from its front face to its rear face. In the example of FIGS. 9 and 10A, each of conductive vias 212 includes a first dielectric portion formed by a layer 208, which is roughly cylindrical in shape and made from a dielectric material, for example a mineral material such as $SiO_2$ or SiN, or a polymer, covering the side walls of hole 203. This layer 208 is, for example, derived from dielectric layer 120 described above, and deposited when first conductive via 113 is made.

This first dielectric layer 208 is covered with a second layer 210, also roughly cylindrical in shape, made from an electrically conductive material such as a metal or a polymer filled with electrically conductive particles. This second layer 210 forms the portion of electrically conductive material of conductive via 212 performing the function of electrical transfer, or conduction, of signals between the front face and the rear face of substrate 102. The material of second layer 210 is preferably chosen such that it forms a satisfactory heat conductor, for example a metal. This second layer 210 is, for example, produced by deposition of electrically conductive layer 122 when first conductive via 113 is made. First layer 208 forms an electrical insulation between substrate 102 and second electrically conductive layer 210. Second electrically conductive layer 210 may be produced from one or more materials given below, for which the thermal conductivity values, in $W \cdot m^{-1} \cdot K^{-1}$, are also given.

Al: 216 $W \cdot m^{-1} \cdot K^{-1}$
Cu: 394 $W \cdot m^{-1} \cdot K^{-1}$
Sn: 63 $W \cdot m^{-1} \cdot K^{-1}$
Ni: 90 $W \cdot m^{-1} \cdot K^{-1}$
Au: 291 $W \cdot m^{-1} \cdot K^{-1}$
W: 197 $W \cdot m^{-1} \cdot K^{-1}$ Second layer 210 is covered with a third layer 213, also roughly cylindrical in shape and made from a dielectric material, for example a mineral material such as $SiO_2$ or SiN, or a polymer. Third layer 213 delimits an empty space 214 of conductive via 212 forming a zone in which a coolant may flow, such as a heat transfer liquid, or a gas, intended to cool the electronic component comprising substrate 102. This empty space 214 is also roughly cylindrical in shape.

Dielectric layers 208 and 213 may each be between approximately 10 nm and several micrometers thick (for example less than approximately 10 μm), in particular when the dielectric is a mineral material.

Second layer 210 may be between approximately several tens of nanometers and several micrometers thick, for example between approximately 10 nm and 10 μm, when this second layer 210 is made from a metal material. Second layer 210 may be more than approximately 10 μm thick when it is produced from a polymer filled with electrically conductive particles.

By means of conductive vias 212, an electrical signal transfer function is performed within the same intraconnections, between the front and rear faces of substrate 102, by means of to electrically conductive layer 210, and a cooling function is performed by means of the coolant flow zone formed by the empty spaces 214, which in this case come through substrate 102 all its thickness.

Large numbers of conductive vias 212 may be integrated in the component, enabling heat to be evacuated from as close as possible to the hot source of the electronic component. Integrating these conductive vias within the actual component containing or forming a heat source thus prevents hot points inside the component from being formed. For example, if the device includes a hot zone in its front face, the flow of a heat transfer liquid or gas through empty spaces 214 enables the heat to be evacuated through this liquid or gas, which captures this heat and evacuates it outside the component. The rear face of the substrate therefore forms an intermediate heat zone.

Although each of conductive vias 212 is, in FIGS. 9 and 10A, cylindrical in shape, these conductive vias may be of a completely different shape if the conductive vias comprise at least one portion of electrically conductive material performing an electrical conduction function, and at least one empty space forming a flow zone for a coolant.

FIGS. 10B to 10F represent top section views of different embodiments of a conductive via 212.

In the example represented in FIG. 10B, hole 203 includes a section, in plane (X,Y) (the plane parallel to the front and rear faces of substrate 102), of rectangular shape. Hole 203 therefore has a rectangular parallelepipedic shape. Empty space 214 also includes, in plane (X,Y), a section of rectangular shape. In addition, unlike the conductive vias described above in connection with FIGS. 9 and 10A, conductive via 212 represented in FIG. 10B does not include a dielectric layer between electrically conductive layer 210 and substrate 102, and electrically conductive layer 210 is directly in contact with the side walls of hole 203. Dielectric layer 208 may in general be present when there is a need to electrically insulate substrate 102 from electrically conductive layer 210.

Another variant embodiment of a conductive via 212 is represented in FIG. 10C. In this variant, hole 203 has a section, in plane (X,Y), of oval shape.

In addition, unlike the example embodiments described above, conductive via 212 has no dielectric layer 213. In this case conductive via 212 is therefore formed from electrically conductive layer 210 positioned against the side walls of hole 203 and of empty space 214, the section of which, in plane (X,Y), is also oval.

Another variant embodiment of a conductive via 212 is represented in FIG. 10D. In this variant, conductive via 212 includes a first electrically conductive layer 210 positioned against the side walls of hole 203, a first dielectric layer 213 positioned against first electrically conductive layer 210, a second electrically conductive layer 210b positioned against first dielectric layer 213, and a second dielectric layer 213b positioned against second electrically conductive layer 210b. Each of these layers 210, 213, 210b and 213b includes a section, in the plane (X,Y), shaped like a ring, and they surround empty space 214. In this variant there are therefore several concentric electrically conductive parts performing the function of electrical conduction between the front and rear faces of substrate 102, where these parts may or may not be independent, depending on whether or not a dielectric layer is present between these parts.

Another variant embodiment of a conductive via 212 is represented in FIG. 10E. In this variant, conductive via 212 includes two separate electrically conductive portions 210a, 210b positioned against the side walls of hole 203. Each of these portions 210a, 210b includes a section, in plane (X,Y), shaped like a portion of a ring. In addition, each of these portions 210a, 210b is covered with a dielectric portion 212a, 212b providing insulation between empty space 214 and electrically conductive portions 210a, 210b.

Another variant embodiment of a conductive via 212 is represented in FIG. 10F. In this variant, conductive via 212 includes several electrically conductive separate portions 210, for example 7 such, positioned against a dielectric layer 208 covering the side walls of hole 203. Each of these portions 210 includes a section, in plane (X,Y), shaped like a portion of a ring. As in the example of FIG. 10E, electrically conductive portions 210 may be covered by a dielectric layer in order to insulate these portions 210 from empty space 214.

In the variants represented in FIGS. 10E and 10F, the electrically conductive portions form, in conductive via 212, a discontinuous electrical contact, i.e. several electrical contacts. It is thus possible to contact several separate electrical contact pads present on the same face of the substrate, whilst keeping a conductive via performing the electrical and thermal conduction functions. In addition, the free zones between electrically conductive portions 210 of the conductive via also allow the coolant (whether gas or liquid) to flow, enabling the dimensions of the central section of empty space 214 to be reduced, and therefore also the diameter of conductive via 212 (dimension as small as approximately 10 µm).

The different variants described above in connection with FIGS. 10A to 10F may be combined with one another: whether or not one or more dielectric layers 208, 213, 213b is/are present; shape of section of hole 203 of conductive via 212 and of the layers positioned against the side walls of hole 203; whether one or more electrically conductive layers 210, 210a, 210b is/are present, in the form of one or more separate portions, to perform the function of electrical conduction of conductive via 212.

Whatever the shape of hole 203, it is possible for empty space 214 to be filled by a porous material, for example a material of the porous sol-gel type, where the pores then form the space for the fluid to flow through conductive via 212. In this case a dielectric layer, for example layer 213, may provide the insulation between electrically conductive layer 210 and the porous material.

FIG. 11 represents schematically an electronic device according to a first embodiment, including several superposed electronic components.

Electronic device 300 includes an electronic card, or printed circuit, forming a support 302. Electrical contacts 304 are produced on a front face 305 of support 302. Electronic device 300 also includes three electronic components 301.1 to 301.3, stacked on top of one another, and positioned on front face 305 of support 302. Each of electronic components 301.1 to 301.3 may have different roles (memory, logical functions, MEMS, passive components, power management, etc.). Although not represented, at least one of electronic components 301.1 to 301.3 includes, on and/or in a substrate of the component, a microcomponent, similar to microcomponent 100 described above, encapsulated using one of the encapsulation methods described above in connection with FIGS. 1 to 8D. Each of electronic components 301.1 to 301.3 includes conductive vias 212 similar to conductive vias 212 described above in connection with FIGS. 9 to 10F, i.e. enabling a function of electrical conduction and a function of heat dissipation within electronic components 301.1 to 301.3 to be performed and, more generally, a function of cooling electronic device 300.

A first electronic component 301.1 includes conductive vias 212 and, more specifically, electrically conductive layers 210 of these conductive vias 212, which are electrically connected to electrical contacts 304 by electrical interconnections 306 positioned between the rear face of first component 301.1 and electrical contacts 304. A second electronic component 301.2 is positioned on first component 301.1, where the conductive vias 212 of second component 301.2 are electrically connected, in a rear face of second component 301.2, to conductive vias 212 of first component 301.1, in a front face of first component 301.1. Electrically conductive layers 210 of conductive vias 212 of electronic components 301.1 and 301.2 are electrically connected to one another through electrical interconnections 306, for example similar to those electrically connecting electrical contacts 304 to conductive vias 212 of first component 301.1, positioned between first component 301.1 and second component 301.2. These electrical interconnections 306 may be insulated metal interconnections such as microbeads, metal pillars or micro-inserts, or alternatively may be interconnections made of polymer filled with electrically conductive particles. In this case electrical interconnections 306 are adapted so as to allow the fluid to flow between components 301.1 to 301.2 whilst forming an electrical connection between conductive vias 212 of these components 301.1 to 301.2.

In a similar manner, a third electronic component 301.3 is positioned on second component 301.2, where conductive vias 212 of third component 301.3 are electrically connected, in a rear face of third component 301.3, to conductive vias 212 of second component 301.2, in a front face of second component 301.2, by electrical interconnections 306 positioned between second component 301.2 and third component 301.3.

In electronic device 300, conductive vias 212 of electronic components 301.1 to 301.3 coupled to one another by electrical interconnections 306 thus form a space in which a coolant may flow, enabling each of electronic components 301.1 to 301.3 to be cooled, and therefore also electronic device 300. The coolant may, for example, be introduced at the front face of device 300, i.e. through conductive vias 212 of third component 301.3 at the front face of third component 301.3. This coolant, and therefore the heat, is then evacuated through conductive vias 212 of first component 301.1, between the rear face of first component 301.1 and support 302. A space is therefore kept between first component 301.1 and support 302 in order that the coolant can be removed from the coolant flow space formed by conductive vias 212. The flow of the coolant within electronic device 300 enables the temperature of electronic device 300 to be made uniform, and enables the step of evacuation of the heat to the exterior to be optimally prepared, for example via a heat exchanger and/or an integrated micro-heatpipe, or any other suitable system which electronic device 300 may include, and which is not represented in FIG. 11. In the example described here, given that the coolant is evacuated between first electronic component 301.1 and support 302, the coolant is preferably a gas, since a liquid might create short-circuits if it were evacuated between support 302 and first electronic component 301.1.

In one variant it is possible, in particular when the density of connections of the electronic device is low given the area of the electronic device, to associate conductive vias 212 described above with channels for the flow of the coolant, also called thermal vias, which are used only for thermal cooling of the device. These thermal vias may be made at the same time as conductive vias 212, and may therefore benefit from all the advantages relating to the production method used at the scale of device 300. The thermal vias may be made by etching holes, for example of roughly cylindrical shape, through the substrates of electronic components 301.1 to 301.3 of device 300, without having any electrically conductive material in the holes. Similarly, it is also possible that some of the conductive vias of device 300 perform only an electrical transfer function, where these vias do not then have any empty spaces enabling a coolant to be made to flow.

When the coolant is a liquid, for example water, which may possibly be deionised, the coolant's flow circuit formed by conductive vias 212 must be closed and sealed, and the interconnections between the components must also be sealed. Conversely, when the coolant is a gas, for example air or any other gas, the coolant's flow circuit may be open or closed, i.e. sealed or unsealed, and the gas flow can be natural or be forced by an external element, for example a ventilator.

The intra-component heat dissipation is accomplished by horizontal and vertical fanning-out within the actual component. Thus, from the initial hot point, the heat is evacuated by distribution towards the exterior, through the substrate.

In the first embodiment described in connection with FIG. 11, conductive vias 212 of electronic components 301.1 to 301.3 are aligned with one another. Such alignment is obtained, for example, when components 301.1 to 301.3 are similar components, where electronic device 300 is then homogeneous.

An electronic device 400 according to a second embodiment is represented in FIG. 12.

In a manner comparable to electronic device 300, electronic device 400 includes three superposed electronic components 301.4 to 301.6 interconnected with one another through electrical interconnections 306 electrically connecting conductive vias 212 of superposed electronic components 301.4 to 301.6.

Unlike electronic component 301.1 described above, electronic component 301.4 is connected to support 302 by microbeads 402.

In addition, unlike electronic component 300, in which conductive vias 212 of components 301.1 to 301.3 are aligned one above the other, the conductive vias of electronic components 301.4 to 301.6 are not aligned with one another. Such a configuration is found, for example, when electronic components 301.4 to 301.6 are different, and when electronic device 400 is a heterogeneous device. However, electrical interconnections 306 are positioned such that conductive vias 212 of electronic components 300.4 to 300.6 form a coolant flow circuit.

The fluid flow circuit formed by conductive vias 212 of electronic device 400 is in this case not sealed, and the fluid is evacuated in the space formed between support 302 and the rear face of electronic component 301.4 which is securely attached to support 302.

In a variant represented in FIG. 13, the apertures formed in conductive vias 212 at the rear face of electronic component 301.4 emerge in sealed spaces 404 formed between support 302 and electronic component 301.4. Holes 406 are also made through support 302 in order that the fluid intended to flow through conductive vias 212 is evacuated outside electronic device 400. The coolant flow circuit formed in electronic device 400 represented in FIG. 13 is thus sealed, and enables, for example, deionised water to be made to flow to cool electronic device 400.

In the particular case of the sealed interconnections, the electronic device may therefore form a 3D micro-heatpipe, provided a judicious choice is made of the coolant, in accordance with the expected temperatures (latent evaporation heat less than the maximum temperature of the system). Fluid flow is then autonomous in the electronic device.

Conductive vias 212 of electronic devices 300 and 400 may in general be made according to any one of the variant embodiments described above in connection with FIGS. 10A to 10F.

Reference is now made to FIGS. 14A to 14E, which represent the steps of making conductive vias 212, in a substrate 102 of an electronic component, performing the electrical conduction and heat dissipation functions. Although not represented, the electronic component in which conductive vias 212 are made also comprises an encapsulated microcomponent which is released via a hole which is also used for making an electrically conductive via.

As represented in FIG. 14A, holes 203 of roughly cylindrical shape, intended to form conductive vias 212, are firstly etched through substrate 102. Holes 203 are formed through the front face and emerge at the rear face of substrate 102. These holes 203 may be obtained through the use of DRIE (Reactive Ionic Etching)-type, laser, chemical or again photo-assisted chemical etching.

The side walls of holes 203 are then covered by first layers 208 of dielectric material (FIG. 14B). These first layers 208 are, for example, obtained through the use of PECVD (Plasma Enhanced Chemical Vapour Deposition), CVD (Chemical Vapour Deposition), spin coating, spray coating, lamination, or again by screen printing, where this deposition may be of the same type as the deposition of layer 120 when first conductive via 113, described above, is made.

As represented in FIG. 14C, first layers 208 are then covered by electrically conductive second layers 210. These second layers 210 are, for example, obtained through implementation of a deposition of the PECVD, CVD, spin coating, spray coating, lamination or screen printing type, or by an electrochemical or electrolytic deposition, where this deposition may be of the same type as the deposition of layer 122 described above to make first conductive via 113.

Both layers 210 are covered by third layers 213 of dielectric material (FIG. 14D). These third layers 213 are, for example, obtained through implementation of a deposition of the PECVD, CVD, spin coating, spray coating or lamination type, or by screen printing, where this deposition may be of the same type as the deposition of layer 124 described above to make first conductive via 113. Remaining spaces 214 of holes 203 form the coolant flow spaces of conductive vias 212.

Lastly, electrical interconnections 306 are formed at the rear face of substrate 102, at conductive vias 212. These electrical interconnections 306 are electrically connected to second electrically conductive layers 210, and are intended to interconnect second layers 210 to electrical contacts made on a support or to conductive vias of another electronic component on which this component is intended to be stacked.

When the coolant used is a liquid or a particular gas, hermetic sealing techniques between electronic components may be implemented in order that the coolant flow spaces are hermetically closed: eutectic metal seal (AuSn, SnAG, AuSi, etc.), direct molecular seal ($SiO_2/SiO_2$, etc.), or again, when the electronic components include, for example, electrostatically charged substrates, and tolerate sealing voltages, of the anodic bonding type.

When conductive vias 212 include several separate electrically conductive portions 210, these portions can be made using an additive technology based on a photolithography operation: the discontinuous electrically conductive portions are created, for example, by an electrolytic growth in hole 203 using a resin mask.

As a variant, these portions may also be produced using subtractive technology. In this case, several electrically conductive pads are produced all the way through substrate 102. Hole 203 is then made through substrate 102 such that it comes through a part of substrate 102 where a part of the conductive pads are located, and thus that it cuts into and removes a part of the conductive pads, where the remaining part of each pad forms one of electrically conductive portions 210. By this means a configuration as represented in FIG. 14F is obtained.

In another variant embodiment, an electrically conductive layer may be deposited on the side walls of hole 203 (which may possibly be previously covered with an insulating layer). Grooves are then etched in the electrically conductive layer such that the remaining portions of the electrically conductive layer form separate portions 210.

According to another example embodiment, hole 203 and grooves along the side wall or walls of hole 203 are formed in substrate 102, at the same time or consecutively. After this, a layer of sacrificial material is deposited in the grooves or on the walls of the grooves, the sacrificial material being distributed so as to form a separation between hole 203 and the grooves. The layer of sacrificial material may be made such that it extends into hole 203. The sacrificial material may be, for example, $SiO_2$ or $Si_3N_4$. After this, a layer of conductive material is deposited so as to line the walls of hole 203 and cover the sacrificial material. The thickness of the layer of conductive material may be made to be less than the thickness of the layer of sacrificial material extending into hole 203. The layer of sacrificial material is then removed, which leads to the conductive material facing the grooves being removed, for example by wet chemical etching. After this removal the conductive zone has the form of several separate conductive portions 210, which are not connected to one another, and which are separated by means of the grooves.

According to another example embodiment, hole 203 coming through substrate 102 is made in substrate 102, together with at least one vertical groove extending all the way through substrate 102, and communicating with hole 203. The groove may be, for example, rectangular or oval in section. Parts of a side wall of hole 203 form a separation between the latter and the groove. The electrically conductive material is then deposited so as to cover one wall of the cavity, and on a part of the groove. The parts forming the separation prevent, by a shadow effect, conductive material being deposited all the way round the groove such that the deposit of the conductive material on the wall of the cavity and on the groove forms a discontinuous zone. The deposition of electrically conductive material may possibly be a "directional" deposition, in which the material is directed at a predetermined angle relative to a normal to the front and rear faces of substrate 102. By this means a conductive portion may be produced along the groove, which is disconnected from the other electrically conductive portions formed on said wall when the conductive material is deposited.

Reference is now made to FIG. 15, which represents an electronic component 500 according to another embodiment. In contrast with the previously described electronic components, a proportion of the active elements and of the electrical interconnection layers of the component are represented.

Electronic component 500 includes substrate 102 on which MOS transistors 504 are produced. Although not represented, an encapsulated microcomponent similar to previously described microcomponent 100 is produced on substrate 102, where this microcomponent has been released via a release hole made through substrate 102, and where this hole is also used to form a conductive via electrically connected to an electrical connection pad positioned in the cavity in which the microcomponent is encapsulated.

Component 500 also includes a first metal interconnection level 506, to which MOS transistors 504 are electrically connected. This first metal interconnection level 506 is connected to a second metal interconnection level 508. Electronic component 500 also includes conductive vias 510 similar to previously described conductive vias 212. In the example of FIG. 7 a single conductive via 510 is represented.

Conductive via 510 is electrically connected to first metal interconnection level 506.

However, unlike previously described conductive vias 212, this conductive via 510 is blind, i.e. one of its ends is closed, its bottom wall being formed by a portion of first metal interconnection level 506. The electrically conductive layer of conductive via 510 is electrically connected to this portion of first metal interconnection level 506. To prevent a short-circuit between first interconnection level 506 and another electrical element the empty space of conductive via 510 is intended to receive a gas as a coolant.

As represented in FIG. 16, conductive via 510 may also be made all the way through electronic component 500. In this variant conductive via 510 is electrically connected to a metal redistribution level 512, forming an electrical contact, made on the front face of electronic component 500. The contact with conductive via 510 is made on the periphery of this contact, in order not to mask the empty space of conductive via 510 and by this means to allow a liquid or gaseous coolant to flow through conductive via 510.

Electronic component 500 may also include both conductive vias 510a similar to conductive via 510 previously described in connection with FIG. 15, i.e. not emerging at one of the faces of electronic component 500, and conductive vias 510b similar to via 510 previously described in connection with FIG. 16, i.e. which come through electronic component 500 all the way through.

Such a configuration is, for example, represented in FIG. 17.

In the previously described examples the conductive vias are made in or through stacked electronic components. Since such conductive vias perform both an electric conduction function and a cooling function, they can also be used as release hole when microcomponents produced on and/or in these electronic components are encapsulated.

This heat dissipation function can also be performed by first conductive via 113 previously described in connection with FIGS. 1 to 8D. Thus, as represented in FIG. 18, first conductive via 113, which was used to etch a dielectric material surrounding microcomponent 100, thus forming cavity 116, is made in a manner similar to one of conductive vias 212 in order to provide an electrical contact with electrical contact pad 104. First conductive via 113 also includes an empty space coming through substrate 102, and forming a flow zone for a coolant, in this case air, between the interior and exterior of cavity 116.

The invention claimed is:

1. A method of encapsulating at least one microcomponent positioned on a first face of a substrate and/or in the substrate, comprising:
   a) production of at least one electrical contact pad on the first face of the substrate;
   b) production of at least one portion of sacrificial material covering at least the microcomponent and at least a part of the electrical contact pad;
   c) production of at least one thick encapsulation layer covering the portion of sacrificial material, and at least a part of the first face of the substrate;
   d) production, through a second face, opposite the first face, of the substrate of at least one first hole aligned at least partially with the electrical contact pad, and emerging at the portion of sacrificial material;
   e) elimination of the portion of sacrificial material through the first hole;
   f) production, at least in the first hole, of at least one portion of electrically conductive material electrically connected to the electrical contact pad, forming a first conductive via.

2. The encapsulation method according to claim 1, in which the electrical contact pad includes at least one portion of electrically conductive material surrounding at least one empty space, wherein the first hole is aligned with the empty space.

3. The encapsulation method according to claim 2, in which the portion of electrically conductive material is shaped, in a plane parallel to the first face of the substrate, in a ring.

4. The encapsulation method according to claim 1, in which the c) production is obtained by deposition of a resin of a polymer type forming the thick encapsulation layer.

5. The encapsulation method according to claim 1, in which the c) production is obtained:
   by cutting a portion of the substrate against which the microcomponent, the electrical contact pad, and the portion of sacrificial material are positioned, followed by
   positioning the portion of the substrate, the microcomponent, the electrical contact pad, and the portion of sacrificial material in a slot formed in at least one second substrate forming the thick encapsulation layer.

6. The encapsulation method according to claim 1, further comprising thinning, after the c) production, of the substrate at its second face.

7. The encapsulation method according to claim 1, further comprising, after the c) production, securing attachment of the thick encapsulation layer to at least one second substrate.

8. The encapsulation method according to claim 1, further comprising, between the b) production and the c) production, deposition of at least one intermediate layer made from at least one dielectric mineral material and/or at least one electrically conductive material covering the portion of sacrificial material, wherein the thick encapsulation layer covers at least the intermediate layer.

9. The encapsulation method according to claim 8, in which, when the portion of sacrificial material is covered by the intermediate layer made of electrically conductive material, at least one portion of electrically conductive material is positioned on the second face of the substrate and connected electrically to the intermediate layer through at least one second hole made through the second face of the substrate, and emerging at the intermediate layer.

10. The encapsulation method according to claim 1, further comprising, before the c) production, production of scribe lines in the substrate, and, after the c) production, cutting the substrate along the scribe lines.

11. The encapsulation method according to claim 1, further comprising, when the portion of electrically conductive material electrically connected to the electrical contact pad does not plug the first hole, a deposition on and/or in the first hole of a dielectric material plugging the first hole.

12. The encapsulation method according to claim 1, further comprising making at least one additional conductive via by implementing:
    making at least one additional hole through the substrate,
    production, in the additional hole, of at least one portion of electrically conductive material extending in the additional hole through the substrate, such that at least one remaining empty space of the additional hole extending through the substrate can form a zone in which a fluid can flow.

13. The encapsulation method according to claim 12, in which production of the portion of electrically conductive material of the first conductive via and/or of the portion of electrically conductive material of the additional conductive via includes deposition of a layer of electrically conductive material against at least a part of the side walls of the first hole and/or of the additional hole.

14. The encapsulation method according to claim 13, further comprising, prior to the deposition of the layer of electrically conductive material, deposition of a first layer of dielectric material against side walls of the first hole and/or of the additional hole, wherein the layer of electrically conductive material is deposited against the first layer of dielectric material, and/or also including deposition of a second layer of dielectric material against the layer of electrically conductive material.

15. A method of production of an electronic device, comprising a least implementation of a method of encapsulating a microcomponent according to claim 12, and secure attachment of the substrate on a support.

16. The method of production according to claim 15, further comprising production of at least one fluid flow channel in the support, and coupling of the fluid flow channel with at least one fluid flow zone formed through the substrate.

17. The method of production according to claim 15, further comprising superposition of multiple electronic components, one on top of another, and coupling of fluid flow zones of the electronic components to one another.

18. The encapsulation method according to claim 1, in which the portion of electrically conductive material of the first conductive via is such that at least one remaining empty space of the first hole extending through the substrate can form a zone in which a fluid may flow.

* * * * *